US007392170B1

(12) United States Patent
McGaughy et al.

(10) Patent No.: US 7,392,170 B1
(45) Date of Patent: Jun. 24, 2008

(54) SYSTEM AND METHOD FOR DYNAMICALLY COMPRESSING CIRCUIT COMPONENTS DURING SIMULATION

(75) Inventors: Bruce W. McGaughy, Fremont, CA (US); Jun Kong, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 612 days.

(21) Appl. No.: 10/713,729

(22) Filed: Nov. 13, 2003

(51) Int. Cl.
*G06F 17/50* (2006.01)
(52) U.S. Cl. ............................... 703/14; 703/13; 703/16
(58) Field of Classification Search ............. 703/13–14, 703/16
See application file for complete search history.

(56) References Cited

U.S. PATENT DOCUMENTS

| | | | |
|---|---|---|---|
| 4,942,536 | A | 7/1990 | Watanabe et al. |
| 5,446,676 | A | 8/1995 | Huang et al. |
| 5,553,008 | A | 9/1996 | Huang et al. |
| 5,910,898 | A | 6/1999 | Johannsen |
| 6,026,226 | A | 2/2000 | Heile et al. |
| 6,035,107 | A | 3/2000 | Kuehlmann et al. |
| 6,083,271 | A | 7/2000 | Morgan |
| 6,237,126 | B1 | 5/2001 | Bonitz |
| 6,301,687 | B1 * | 10/2001 | Jain et al. ............ 716/3 |
| 6,339,836 | B1 | 1/2002 | Eisenhofer et al. |
| 6,374,205 | B1 | 4/2002 | Kuribayashi et al. |
| 6,449,761 | B1 | 9/2002 | Greidinger et al. |
| 6,553,543 | B1 * | 4/2003 | Weber ............ 716/3 |
| 6,571,377 | B2 | 5/2003 | Narita |
| 6,577,992 | B1 * | 6/2003 | Tcherniaev et al. ........ 703/14 |
| 6,807,520 | B1 | 10/2004 | Zhou et al. |
| 6,865,525 | B1 | 3/2005 | Zhong |
| 2003/0237067 | A1 | 12/2003 | Mielke et al. |
| 2004/0078767 | A1 | 4/2004 | Burks et al. |

OTHER PUBLICATIONS

Celestry Design Technologies, Inc. (2001). *Celestry BSIM Pro+™ Basic Operations*, User Manual, Version 2001.3, Table of Contents, pp. iii-xiii.

(Continued)

*Primary Examiner*—Kamini Shah
*Assistant Examiner*—David Silver
(74) *Attorney, Agent, or Firm*—Wheelock Chan LLP; Thomas Chan

(57) ABSTRACT

A system for dynamically compressing circuit components during simulating of a circuit having a hierarchical data structure includes a simulator module having one or more computer programs for 1) selecting a group of leaf circuits from the first and second branches for simulation, 2) if two or more leaf circuits of the circuit having a substantially same isomorphic behavior, representing the two or more leaf circuits as a merged leaf circuit, 3) creating a first port connectivity interface dynamically for the group of leaf circuits in response to the merged leaf circuit, where the first port connectivity interface communicates changes in signal conditions among the group of leaf circuits, and 4) simulating the group of leaf circuits in accordance with the first port connectivity interface. Since the system dynamically compresses two or more leaf circuits which demonstrate substantially same isomorphic behavior into a merged leaf circuit, there are less number of circuits in the dynamic database and less number of computations are performed during simulation. Therefore, the system uses less memory and achieves higher simulation performance.

24 Claims, 25 Drawing Sheets

OTHER PUBLICATIONS

Celestry Design Technologies, Inc. (2001). *Celestry BSIM Pro+™ Device Modeling Guide*, Version 2001.3, Table of Contents, pp. iii-xii.

Celestry Design Technologies, Inc. (2001). Chapters 3,4,6, and 8 In *Celestry BSIM Pro+™ Basic Operations*, User Manual, Version 2001.3, pp. vii-xiv, 3.1-4.32, 6.1-6.14, and 8.1-8.54.

Celestry Design Technologies, Inc. (Sep. 2001). Chapters 1 and 2 In *Celestry BSIM Pro+™ Device Modeling Guide*, Version 2001.3, pp. i-xii, 1.1-2.50.

* cited by examiner

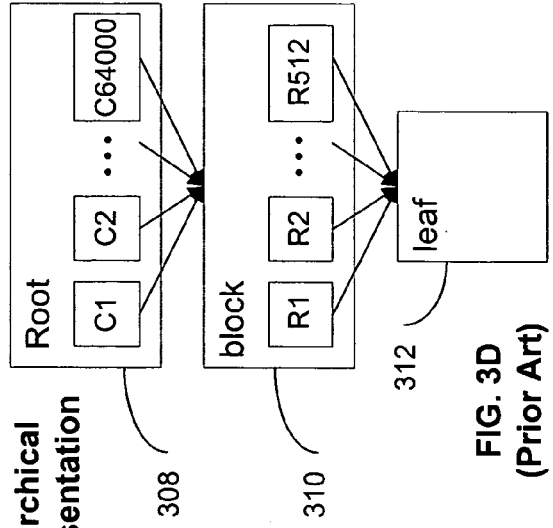
FIG. 3C (Prior Art)
FIG. 3D (Prior Art)
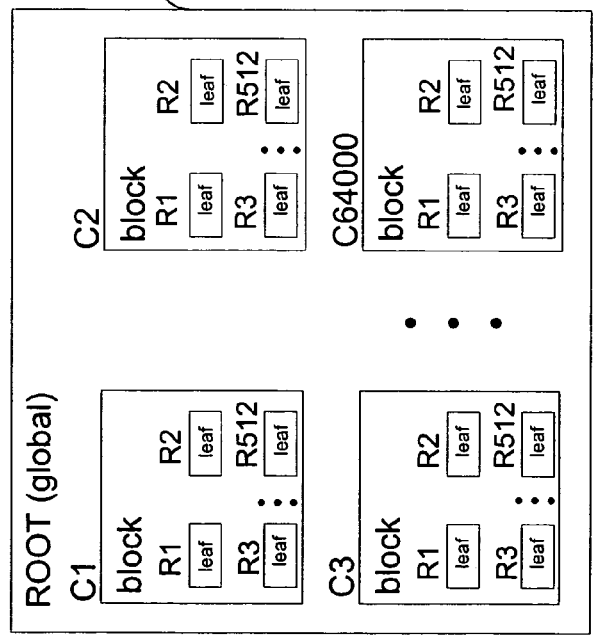
FIG. 3A (Prior Art)
FIG. 3B (Prior Art)

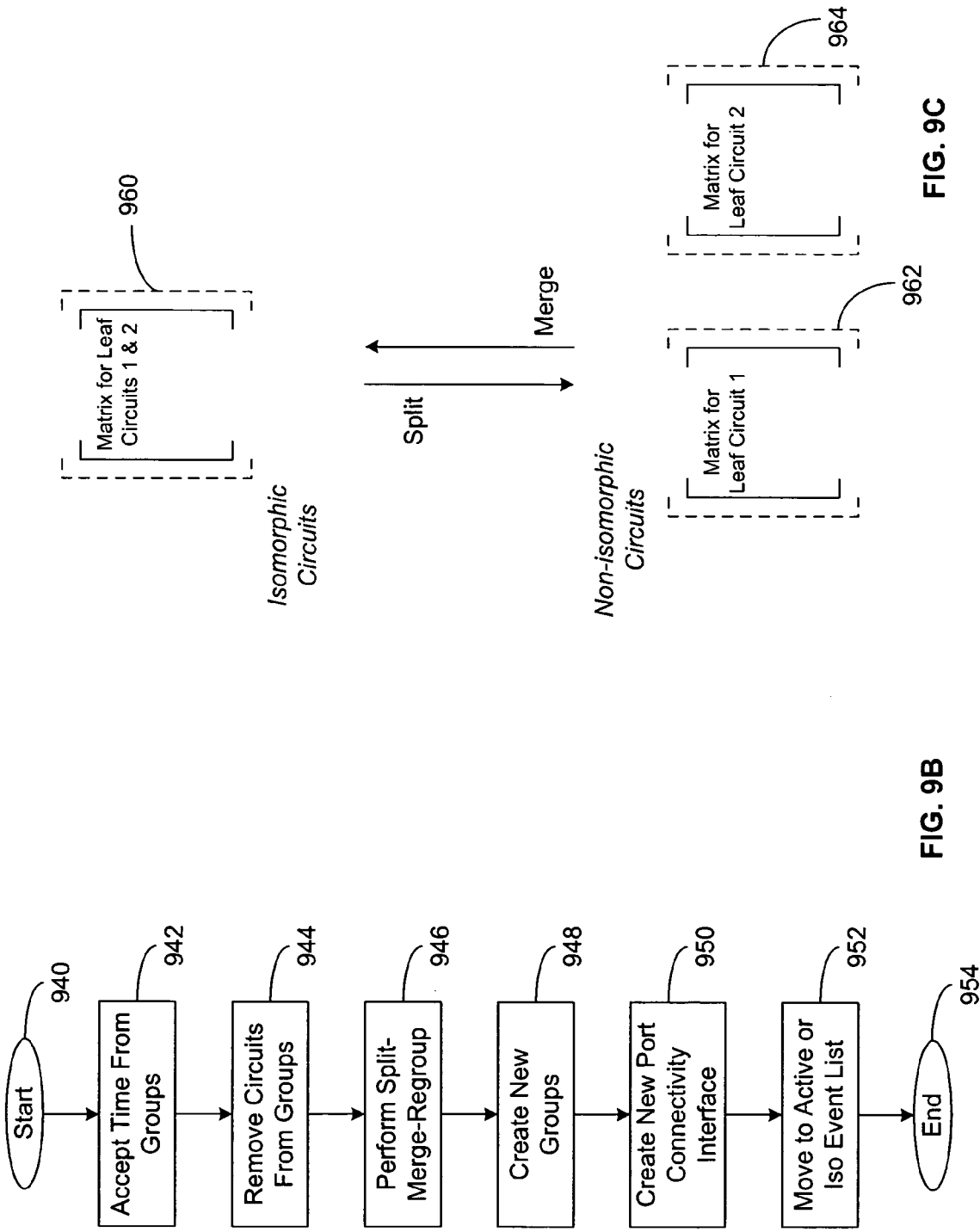

During Simulation When One Of The Sense Amplifiers Is Active And The Column Driven By The Sense Amplifier Is Inactive

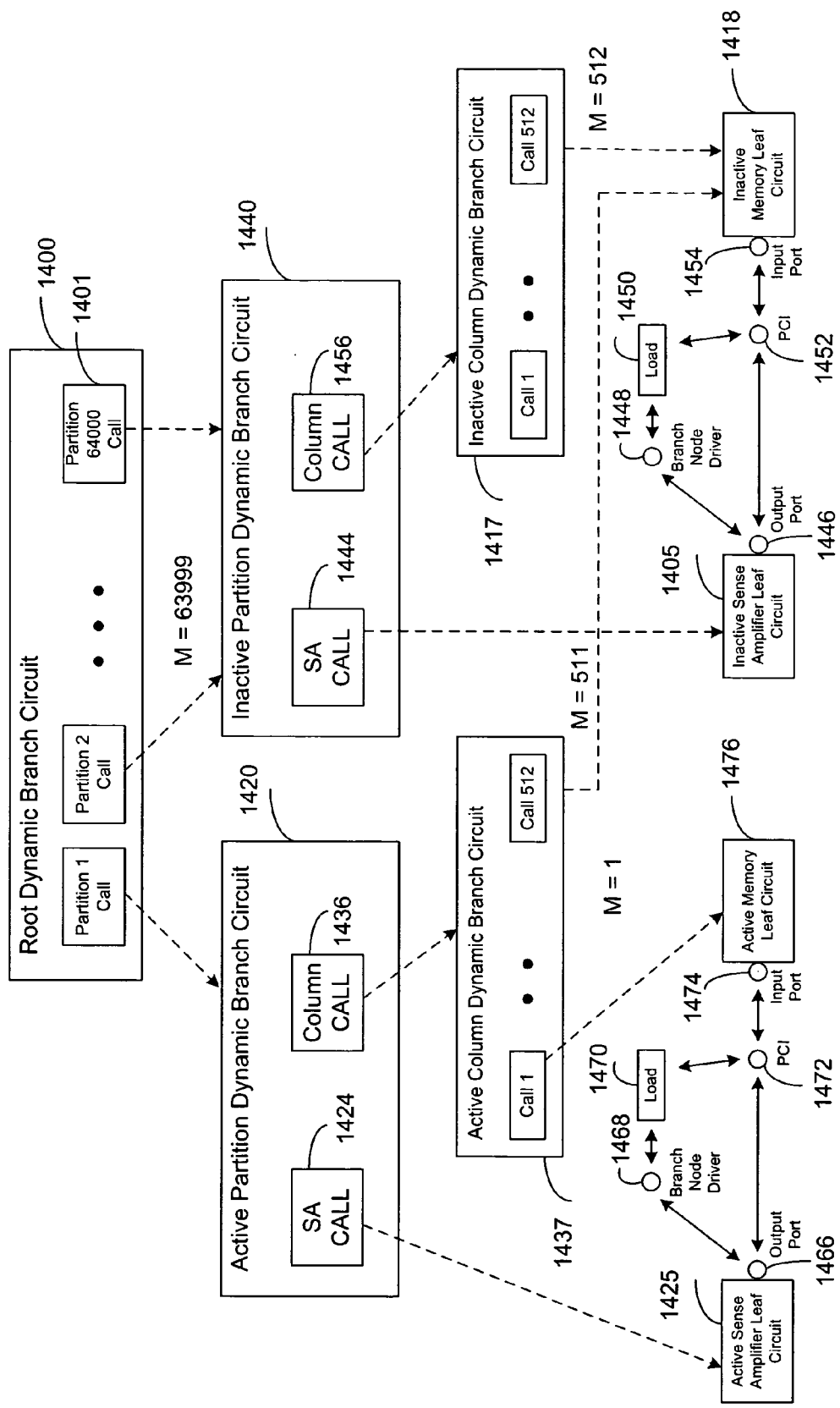
FIG. 14C  During Simulation When One Of The Memory Leaf Circuits Driven By The Corresponding Active Sense Amplifier Is Active

SYSTEM AND METHOD FOR DYNAMICALLY COMPRESSING CIRCUIT COMPONENTS DURING SIMULATION

RELATED APPLICATIONS

This application is related to the following applications, each of which is filed on the same date as this application and is hereby incorporated by reference in its entirety: System and Method For Simulating A Circuit Having Hierarchical Structure, application Ser. No. 10/724,277; System And Method For Adaptive Partitioning Of Circuit Components During Simulation, application Ser. No. 10/713,751, U.S. Pat. No. 7,024,652; System And Method For Communicating Simulation Solutions Between Circuit Components In A Hierarchical Data Structure, application Ser. No. 10/713,754; System And Method For Supporting Multi-rate Simulation Of A Circuit Having Hierarchical Data Structure, application Ser. No. 10/713,753 and System And Method For Dynamically Representing Repetitive Loads Of A Circuit During Simulation, application Ser. No. 10/713,728.

FIELD OF THE INVENTION

The present invention relates to the problem of predicting with simulation the behavior of integrated circuits. In particular, the invention relates to machine-implemented simulation of integrated circuits, where the simulated circuits may have relatively high component density and may have hierarchical data structure.

BACKGROUND OF THE INVENTION

It is often desirable in the microelectronics industry to be able to implement physical solutions in as little time as possible for coping with new market opportunities and/or emerging problems. Computer-provided simulations are often used to predict the behaviors of to-be-manufactured integrated circuits or other like systems. This is preferably done before the integrated circuits are finalized so that design errors may be corrected and design parameters may be optimized prior to mass production. It is well known, for example, to use computers and software simulators such as SPICE™ for obtaining fairly accurate predictions of the analog behaviors of complex circuitry.

SPICE-like simulations may provide fairly accurate predictions of how corresponding circuits will behave when actually built. The predictions are preferably made not only for individual sub-circuit but also for whole systems (e.g., whole integrated circuits) so that system-wide problems relating to noise and the like may be uncovered and dealt with. FIG. 1A illustrates a general process flow of a SPICE-like simulation. An analog integrated circuit under simulation is often represented in the form of a netlist description 102. A netlist is a circuit description of the analog circuit to be simulated written in a SPICE-like language. SPICE netlists are pure structural languages with simulation control statements. Other language like Verilog-A™ has the capability to include behavioral constructs. The structural netlist of SPICE together with a predefined set of circuit components of the analog integrated circuit may be represented in the form of a matrix 104 in accordance with certain circuit modeling methodologies (which is not a concern of the present invention). The number of non-linear differential equations ranges from 1 to n. There is a corresponding number of input vectors to be operated by the linear equation. The set of input vectors are shown as $\{I_1, I_2, \ldots I_n\}$ 106. Next, the linear matrix is computed with the set of input vectors to generate a set of solution vectors $\{V_1, V_2, \ldots V_n\}$ 108. The computation is repeated until the set of solutions converge. The set of solutions may be then displayed in the form of waveforms, measurements, or checks 110 on a computer screen for engineers to inspect the simulation results.

However, SPICE-like simulation of a whole system becomes more difficult and problematic as the industry continues its relentless trek of scaling down to smaller and smaller device geometries and of cramming more interconnected components into the system. An example of such down scaling is the recent shift from micron-sized channels toward deep submicron sized transistor channel lengths. Because of the smaller device geometries, circuit designers are able to cram exponentially larger numbers of circuit components (e.g., transistors, diodes, capacitors) into a given integrated circuit (IC), and therefore increases the matrix size to a complexity which may not be solved in a desired time frame.

FIG. 1B illustrates a matrix representation of the partitions of a complete system of FIG. 1A. As shown in FIG. 1B, the matrix 104 may include groups of sub-matrices, namely matrices for partitions 1 through L 120, each sub-matrix 120 includes a set of equations representing the corresponding circuit partition. In general, the task of an analog simulation engine is to solve a system of non-linear differential equations. One of the most common approaches is to form a set of linear equations in a matrix and to solve them with a matrix solver. Although there are many optimizations and improvements available for matrix solvers to improve computation efficiency, the complexity of the algorithms is quite high that performance suffers as the matrix size increases. The increase in matrix size is due to the fact that identifying partitions is not obvious since the electrical characteristics of the partitions are rarely completely disconnected.

Each sub-matrix 120 may further include matrices representing individual circuits in the partition. As the number of circuit elements in an integrated circuit continues to increase, the size of the matrix 104 may become exponentially large. This results in long simulation cycles and therefore long product development cycles. Another problem with solving the circuit represented by the matrix 104 is that it does not concern about the extend of the communications 130 happening between the partitions during simulation. For example, if there is not much communication between the partitions, that is, the partitions are loosely coupled, then it would be more efficient to compute the individual partitions with their corresponding block matrices instead of computing the partitions together in one large matrix.

As the product development cycles continue to shorten, there is a need for the makers of SPICE-like simulators to come up with new ways to quickly and accurately predict the system-wide behaviors of these exponentially more dense and more complex analog integrated circuit designs. Representing analog integrated circuits in a hierarchical data structure is one of the known methods in addressing the problem stated. In designs that employ hierarchical data structure, opportunities exist for taking advantage of the redundant behaviors that are sometimes exhibited by structurally redundant subcomponents of the hierarchical structure. Examples of integrated circuits which tend to exhibit extensive hierarchical data structure include high-density memory chips such as SRAMs, DRAMs, EEPROMs, etc. Parallel data processing systems and telecommunication systems also tend to have hierarchical structures with redundant subcomponents. FIG. 2 illustrates a repetitive structure of a typical memory circuit. As shown in FIG. 2, the memory circuit includes 64,000 repetitive columns 202, each of the column includes 512 repetitive rows and each row is represented by a row branch circuit 204 which in turn calls to a leaf circuit 206. All 512 repetitive rows in the column are connected together through a node 208, and each node is driven by a sense amplifier 210.

A problem with the current methodologies in simulating the type of repetitive circuit structure of FIG. 2 is that such methodologies do not take advantage of the fact that loads of the repetitive circuit are substantially the same in most situations and only a few loads change dynamically during simulation. For instance, there are 64,000 loads representing the 64,000 columns of memory, and some of the columns have substantially the same loads during simulation.

Yet another problem with the current methodologies in simulating the type of repetitive circuit structure of FIG. 2 is that the load of the leaf circuit 206 in each row is referenced individually. When there is a change at the input port of one of the leaf circuits 206, all loads of the leaf circuits in the column need to be communicated through the hierarchical data structure to the driver sense amplifier circuit. This would result in at least 512 hierarchical traversals in communicating the changes of signal conditions at an input port of a leaf circuit in the column.

FIG. 3 illustrates various representations of the memory circuit of FIG. 2. FIG. 3A illustrates a netlist representation of the memory circuit of FIG. 2 in a machine readable language. FIG. 3B illustrates a physical representation of the same memory circuit of FIG. 2. The physical view represents the potential circuit layout, which illustrates the instantiations and duplication of components throughout the hierarchy. The top level circuit is called the Root which includes substantially the same sub-circuits from C1 to C64000, each representing a column of the memory circuit. Each column includes substantially the same row circuits from R1 to R512, each representing a row of the memory circuit. Each row includes a substantially the same leaf circuit. FIG. 3C illustrates a flatten representation of the same memory circuit of FIG. 2. In a flattened representation, all leaf circuits are illustrated on the same level. Hierarchy is collapsed and is represented by different instance names. For instance, the leaf circuits in the block C1 are called C1.R1, C1.R2, C1.R3, and so on. Other leaf circuits in the other column blocks are named in a similar manner. FIG. 3D illustrates a hierarchical representation of the same memory circuit of FIG. 2. The hierarchical representation illustrates graphically the individual components and is capable of combining duplicated representations of the same structural component. At the Root level 308, there are 64000 substantially the same instances of the same block, namely C1 to C64000. At the block level 310, there are 512 substantially the same instances of the leaf circuit, namely R1 to R512. At the circuit level 312, there is only one instance of the leaf circuit.

Rather than instantiating and simulating all the redundant subcomponents of a system individually, it is possible to pick one of many, alike subcomponents and to consider the picked subcomponent as having a behavior that is representative of the behaviors of the others. The predicted behavior results obtained for the representative one subcomponent may be duplicated for the others without repeating the computational intensive simulation processing for each of the redundant subcomponents. As such, a significant amount of computing time and computational resources may be saved if redundant subcomponents may be identified and their behaviors may be predicted in this way. As described in FIG. 6, the hierarchical data structure has the problem of communicating changes of signal conditions between circuits in different branches of the hierarchical data structure.

FIG. 4 illustrates a process for creating a simulation database for a circuit represented in hierarchical data structure. The process starts with a SPICE netlist 402. Next, a parser creates a primitive database 404 from the netlist 402. The primitive database 404 contains components such as subcircuits and primitives of the SPICE netlist 402. Since these components are usually parameterized, a compilation step is performed on the primitive database to annotate the primitives with their actual parameters and creates a set of actual instances. These instances are stored in the simulation database 406 having one element per unique parameter set.

Prior to simulation, the process of static partitioning is performed on the simulation database 406. This process identifies the topology information of a circuit, including all the components in a circuit, the input and output ports of each circuit component, and the connections among the circuit components through their corresponding input and output ports. During simulation, the process of dynamic partitioning is performed on the simulation database.

A problem with the simulation database 406 is that it does not distinguish between the static information and the dynamic information necessary for simulating a particular partition of the circuit during certain period of the simulation. Hence, the simulator carries a large amount of information for the whole circuit. In addition, during simulation, when there is a need to duplicate a partition of a circuit, the whole topology as well as the dynamic state of the partition is duplicated, which results in more memory usage and potentially more computations. Another disadvantage of combining both static and dynamic information of a circuit into a single simulation database is that whenever a partition of the circuit is duplicated dynamically during the simulation, the simulation database is modified, including the static information of the circuit, which may not need to be modified.

FIG. 5 illustrates a method for performing the static partitioning step in FIG. 4 for building the simulation database. First, the ground nodes of the circuit are marked. In the exemplary circuit, there are two ground nodes 502 and both are marked with the label 1. Next, the power nodes driven by voltage sources are marked. There is one power node 504 and it is marked with the label 2. Then, the channel connection nodes which connect two transistors together are marked. There are four channel connection nodes 506 and they are marked with the label 3. The input ports 508 are marked with the label I, the output ports 510 are marked with the label O and the internal nodes are marked with the label N. Note that a channel connection node may be an output port in certain instances, and may be an internal node in some other instances. The gate terminal of a transistor has typically high impedance, and thus separates the coupling between one group of circuits from another group of circuits. In this exemplary circuit, the gate terminal of the second partition 514 separates the output signal from the first partition 512. This separation forms a natural boundary for the first and second partitions of the exemplary circuit.

As shown in FIG. 5, there are two partitions created for this circuit. During simulation, a simulation solution of partition 1 may need to be communicated to partition 2. Similarly, the changes at the input of partition 2 may also affect the load seen by partition 1, this information too may need to be communicated back to partition 1. It is possible that one output port may have many loads, that is, one output port may have many receivers in different partitions.

FIG. 6 illustrates a method of communicating a simulation solution in a hierarchical data structure. A simulation solution may be communicated in both forward direction and backward directions. A five-level hierarchical data structure is shown here for purpose of illustration. In reality, the number of levels of hierarchy depends on the actual circuit design. In FIG. 6, when the signal conditions at the output port of the inverter leaf circuit 620 change, this information may need to be propagated to all receivers of the inverter, one of such receivers is the next leaf circuit 622. In a hierarchical data structure, a forward propagation is communicated to as many potential receivers as possible. The information is propagated up the hierarchy to the anchor node 602 and from there the information is propagated down one level at a time until the information reaches all the receivers. At each intermediate level, the information received at that level are synchronized before passing to the next level.

For reverse propagation, when the signal conditions change at the input port of the inverter leaf circuit 620, this change affects the load of the output driver which drives the leaf circuit 620. This is because the impedance, capacitance and the current consumed by the receiver leaf circuit changes. In this case, the driver output port may need to be informed of the change in load of leaf circuit 620. As shown by the dotted arrows, reverse propagation passes information directly to the root circuit 602 and from there the information is propagated down one level at a time. From the root circuit 602, the simulator finds all the branches that need to receive the information and propagates down the hierarchy one level at a time. At each intermediate level, the information received at that level are synchronized before passing to the next level.

A problem with the method of communicating changes of signal conditions as illustrated in FIG. 6 is that in order to communicate such information from one leaf circuit to other leaf circuits, the information needs to traverse many levels of the hierarchical data structure before reaching its destination. At each hierarchical level, information needs to be synchronized before it may be transmitted to the next level. Therefore, the method of passing information through the hierarchies and synchronizing at each intermediate level result in lower simulation performance.

SUMMARY

A system for dynamically compressing circuit components during simulating of a circuit having a hierarchical data structure includes at least one processing unit for executing computer programs, a memory for storing static and dynamic information of the circuit, and a user interface for performing at least one of the functions selected from the group consisting of entering a netlist representation of the circuit, viewing representations of the circuit on a display, and observing simulation results of the circuit. The system further includes a simulator module having one or more computer programs for representing the circuit as a hierarchically arranged set of branches, including a root branch and a plurality of other branches logically organized in a graph. The hierarchically arranged set of branches includes a first branch that contains one or more leaf circuits and a second branch that also contains one or more leaf circuits. The first branch and second branch are interconnected in the graph through a third branch at a higher hierarchical level in the graph than the first and second branches. The simulator module further contains computer programs for 1) selecting a group of leaf circuits from the first and second branches for simulation, 2) if two or more leaf circuits of the circuit having a substantially same isomorphic behavior, representing the two or more leaf circuits as a merged leaf circuit, 3) creating a first port connectivity interface dynamically for the group of leaf circuits in response to the merged leaf circuit, where the first port connectivity interface communicates changes in signal conditions among the group of leaf circuits, and 4) simulating the group of leaf circuits in accordance with the first port connectivity interface.

Since the system dynamically compresses two or more leaf circuits which demonstrate substantially same isomorphic behavior into a merged leaf circuit, there are less number of circuits in the dynamic database and less number of computations are performed during simulation. Therefore, the system uses less memory and achieves higher simulation performance.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the following drawings.

FIG. 3A illustrates a netlist representation of the memory circuit of FIG. 2 in a machine readable language.

FIG. 3B illustrates a flatten representation of the same memory circuit of FIG. 2.

FIG. 3C illustrates a flatten representation of the same memory circuit of FIG. 2.

FIG. 3D illustrates a hierarchical representation of the same memory circuit of FIG. 2.

FIG. 9B illustrates a method for processing an isomorphic event.

FIG. 9C illustrates a process of isomorphic partitioning.

FIG. 14C illustrates a method for sharing loads of the memory circuit of FIG. 2 during a different phase of the simulation.

DESCRIPTION OF THE EMBODIMENTS

Figure 1A:
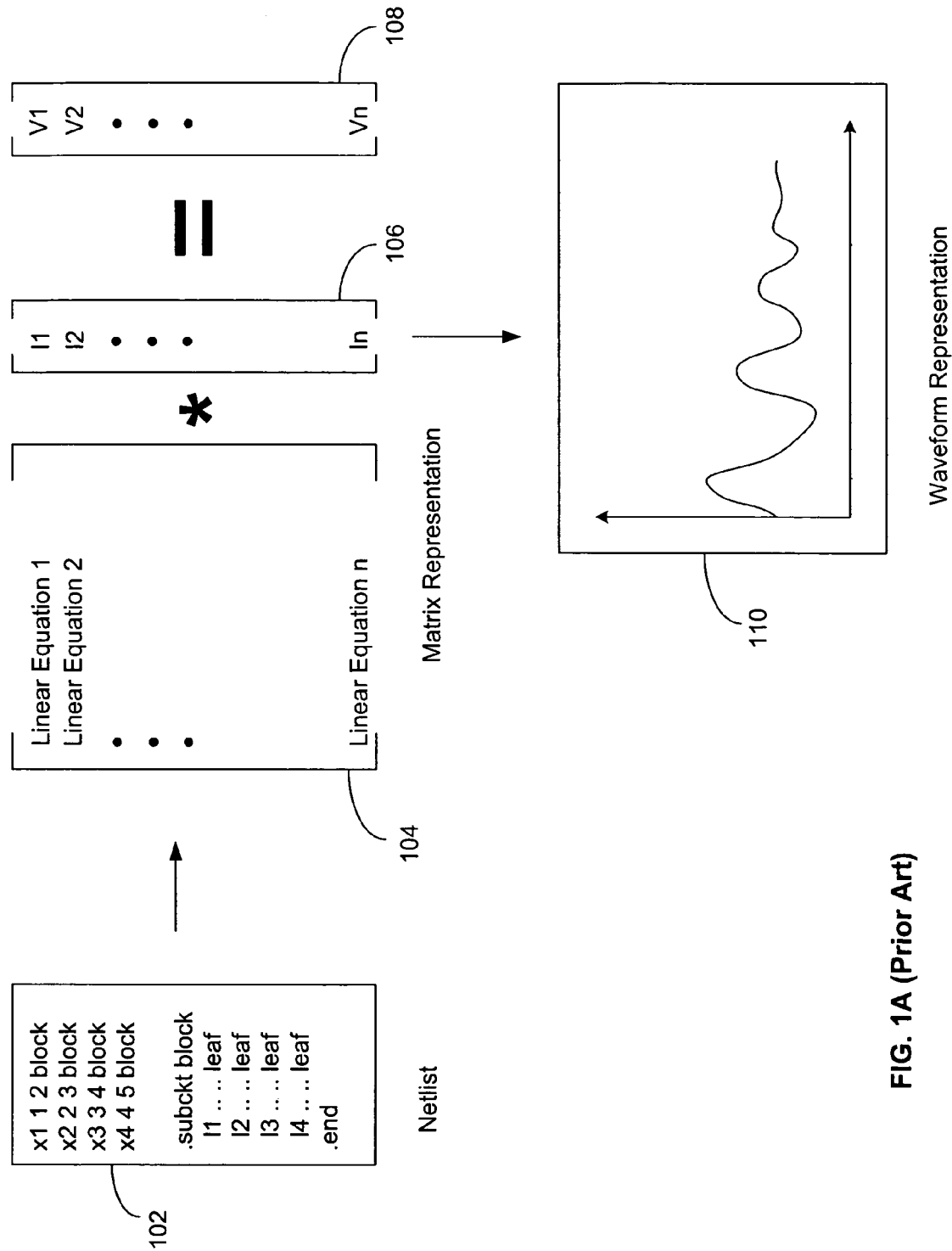
FIG. 1A illustrates a general process flow of a SPICE-like simulation.
Figure 1B:
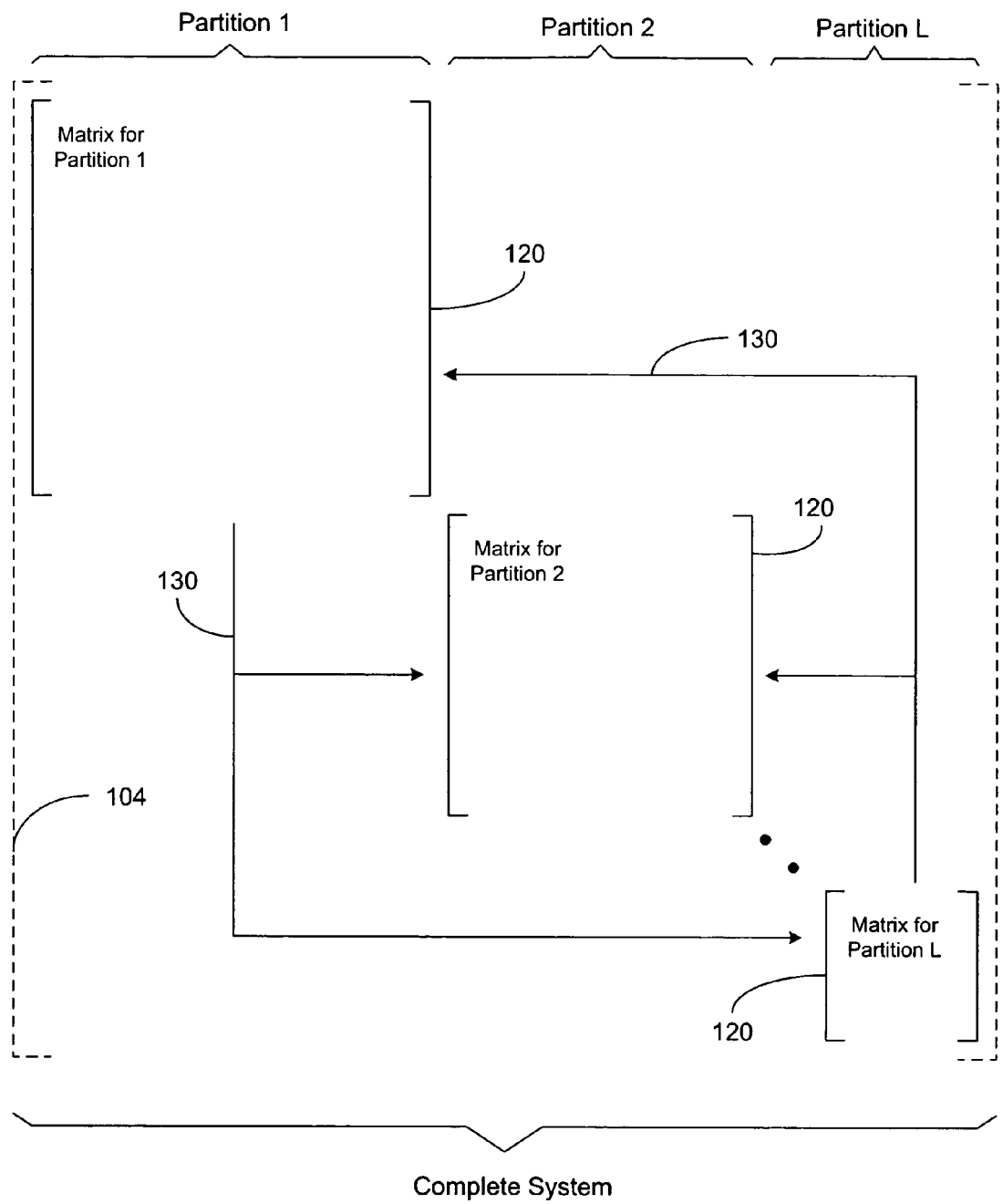
FIG. 1B illustrates a matrix representation of the partitions of a complete system of FIG. 1A.

The following description is provided to enable any person skilled in the art to which the invention pertains to make and use the invention and sets forth the best modes presently contemplated by the inventors for carrying out the invention. Various modifications, however, will remain readily apparent to those skilled in the art, since the basic principles of the present invention have been defined herein specifically to implement a circuit simulator having a hierarchical data structure. Any and all such modifications, equivalents and alternatives are intended to fall within the spirit and scope of the presently claimed invention.

DEFINITIONS

Primitive Database (PDB). A primitive database is a database containing the skeleton of the data structure and connectivity of a circuit. It contains unresolved parameters of the components of the circuit.

Static Database (SDB). A static database contains the topology and geometry of a circuit under simulation. It represents the physical design of the circuit with resolved parameters and is referenced by the simulator for creating the dynamic database during simulation.

Dynamic Database (DDB). A dynamic database contains the structural connections of the circuit under simulation. The dynamic database includes branch circuits which provides references to other branch circuits and/or leaf circuits. In addition, the dynamic database includes dynamic state information of a group of circuits and their corresponding data structures. The dynamic state information and their corresponding data structures carry only the essential information for computing the particular group of circuits under simulation. They do not contain the detail topology information as in the SDB. However, the SDB is referenced and information may be retrieved from the SDB to duplicate the dynamic state information of the group of circuits being simulated in case a split operation is performed.

Netlist. A netlist includes structural modeling constructs and instantiations of a fixed set of devices with potential models and parameter statements. Most netlists include additional simulation control statements. It is a description of an integrated circuit written in a language for inputting a circuit design into a form readable by a computer. A SPICE netlist is a list of circuit description that is readily understood by a SPICE-like simulator.

Flattening. The flattening process combines certain circuit components together as one flattened circuit. In certain situations, it may be more efficient to simulate the circuit components together without the hierarchical structure.

Static Isomorphic Partitioning. Static isomorphic partitioning is a process for identifying circuit components for simulation. For example, a gate terminal of a transistor is a good partitioning point because of its high impedance forms a good boundary for separating different circuit components. In the process of static partitioning, input ports, output ports, ground nodes, power nodes, channels connecting transistors, connectivity between circuit components, and how related circuit components communicate with each other are identified.

Dynamic Isomorphic Partitioning. Dynamic isomorphic partitioning is a process for identifying and combining circuit components which have 1) substantially the same waveforms at the input ports of the circuit; 2) substantially the same loads at the output port of the circuit; and 3) substantially the same states (signal conditions) during a particular period of interest.

Dynamic Adaptive Partitioning. Dynamic adaptive partitioning is a process for optimizing a matrix for solving a group of leaf circuits by examining the strength of coupling between the group of leaf circuits. The strength of coupling between two leaf circuits are deemed to be strongly coupled if the combined resistive, capacitive and inductive coupling between the two leaf circuits is less than a predefined threshold level. On the other hand, the strength of coupling between two leaf circuits are deemed to be weakly coupled if the combined resistive, capacitive and inductive coupled between the two leaf circuits is larger than a predefined threshold level. If two or more leaf circuits demonstrates strong coupling between each other, it is more efficient to combine them in a single larger matrix and solve them together. On the other hand, if two leaf circuits demonstrate weak coupling between each other, it is more efficient to solve each leaf circuit separately with its corresponding leaf circuit matrix.

Leaf Circuit. A leaf circuit is a self-contained circuit entity. It normally resides at the lowest level of the hierarchical data structure. A leaf circuit may be a stand alone simulation unit. It may contain a set of elements and may represent a predefined well isolated sub-circuit. Since it is at the lowest level of the data structure and self-contained, it may be solved as a standalone unit or together with other neighboring circuit components.

Branch Circuit. A branch circuit, or dynamic branch circuit, contains the topology structure of one or more leaf circuits or other branch circuits. A branch circuit contains references to leaf circuits or other actual circuit components through a share manager or through calls to lower levels.

Input Port (IP). An input port is a data structure residing inside a leaf circuit. It is coupled to the input of the leaf circuit. Its function is to connect the leaf circuit to a port connectivity interface.

Output Port (OP). An output port is a data structure residing inside a leaf circuit. It is coupled to the output of the leaf circuit. Its function is to connect the leaf circuit to multiple port connectivity interfaces and loads. In addition, an output port drives multiple branch node drivers, each of which in turn drives multiple loads. Hence, an output port indirectly drives multiple loads.

Branch Node Driver (BND). A branch node driver is a data structure for connecting the output port of a driver leaf circuit to the input port of a receiver leaf circuit. Every BND has a load, and a BND may share its loads with other BNDs. A branch node driver may drive one or more input ports, but it may be driven only by one output port.

Load (L). A load represents an approximation of the total capacitance and impedance of one or more circuit components seen by the output port of a driver circuit or by a branch node driver. A load may be shared by multiple output ports.

Port Connectivity Interface (PCI). A port connectivity interface, also referred to as a net, is a communication center between various data structures such as the input port (IP), the output port (OP), the branch node driver (BND) and the load (L). A PCI includes a vector of input ports, a vector of output ports, a vector of shared loads, an event reference, and an map for storing information concerning the relationship between the input ports and the loads. The map is typically a two-dimensional array with each column associated with a load and each row associated with an input port. A numerical number in the array indicates the number of times an input port contributes to the total capacitance and impedance of a load in the form of redundant or multiple connections. A PCI is dynamically created and recreated during simulation.

Call. A call is used in conjunction with branch circuits. A static branch circuit may include one or more static calls, which indicate the connectivity of a static branch circuit to other static branch circuits and leaf circuits. A dynamic branch circuit may include one or more dynamic calls, which references other dynamic branch circuits and leaf circuits.

Group Circuit. A group circuit, also referred to as a group, is a temporary storage of one or more leaf circuits during simulation. It is a part of the dynamic database created during simulation. A group circuit is distinguished from a branch circuit in that it contains one or more leaf circuits and it does not contain topology information of the leaf circuits. A group circuit is associated with a matrix solver. A group circuit is also associated with an event, which supports adding and deleting circuits in the group dynamically by a group manager.

Group Circuit Matrix. A group circuit matrix, also referred to as a group matrix, is a matrix having a set of equations that represent the one or more leaf circuits contained in the group circuit. The group circuit matrix also contains solution vectors corresponding to the set of equations.

Solver. A solver, also referred to as a group solver, is a mathematical function that solves the set of equations representing the group circuit matrix.

Communication. A communication is a piece of information, normally represented as an electrical parameter such as a voltage or a current, produced by a (leaf or group) circuit that typically needs to be transmitted to other circuits that may be affected by the change in this piece of information.

Event. An event is an activity occurring during the simulation that needs to be handled by the simulator. It typically involves certain changes to the circuit under simulation. An event is associated with a group circuit and every leaf circuit within the group circuit shares the same event. It stores a time stamp of the group circuit at which the leaf circuit(s) in the group need to be evaluated.

Solution. A solution of a circuit is the dynamic state of a circuit computed during simulation. The dynamic state of a circuit includes both internal signal conditions as well as external signal conditions, such as changes of signal conditions at an input port or an output port of a circuit. Examples of signal conditions include node voltages, branch currents, node charges and other indications of signal conditions.

Forward Communication. A forward communication is a communication of changes of signal conditions from an output port of a driver circuit to input ports of receiver circuits that may be affected by such changes. Information communicated may include the output voltage, the rate of change of voltage at the output port of the driver circuit.

Reverse Communication. A reverse communication is a communication of changes of signal conditions from an input port of a receiver circuit to an output port of a corresponding driver circuit. Information communicated may include the input current, impedance and capacitance at the input port of the receiver circuit, which are approximate representations of actual coupling of circuit components for the purpose of decoupling such circuit components and their corresponding solutions.

Event Queue. An event queue is a container that stores a list of events. An event may be associated with a group circuit, a port connectivity interface, or an output port. A scheduled event queue provides a time order of the events. In addition, it allows the simulator to work on a particular event for a period of time before working on the next event. An event contains an event time, which is used for providing a time reference in the process of communicating information between circuits.

Active Event List. An active event list contains a list of group circuits that need the attention of the simulator to solve for solutions.

Adaptive Event List. An adaptive event list contains a list of group circuits that need the attention of the simulator to group or regroup sub-circuits of a corresponding group circuit based on the strength of coupling between the sub-circuits.

Converged Event List. A converged event list is a list of group circuits that have been solved and reached converged solutions.

Isomorphic Event List. An isomorphic event list contains a list of group circuits that need the attention of the simulator to merge or split sub-circuits of a corresponding group circuit due to the convergence or divergence of isomorphic behavior between the sub-circuits. An isomorphic event is referenced and handled by either a port connectivity interface or an output port.

Merge. A merge is a dynamic process of combining two or more circuits into one isomorphic circuit due to the convergence of isomorphic behavior of the two or more circuits during simulation.

Split. A split is the opposite of a merge. A split is a dynamic process of separating an isomorphic circuit into two or more individual circuits due to the divergence of isomorphic behavior of the two or more circuits during simulation.

Grouping. A grouping operation is a process of combining two or more circuit matrices into a larger group matrix in association with adaptive partitioning. When two or more circuits are tightly coupled to one another during certain period of the simulation, it creates repetitive communications between the two or more circuits and thus requires more number of computational iterations in simulation if the two or more circuit matrices remain separated. By combining the two or more matrices into a larger group matrix, explicit communications between the circuits, such as passing of information from one circuit to another through the port connectivity interface, are no longer required for solution purposes because such information is passed through the matrix directly. Hence the simulation efficiency is improved because the number of computational iterations is reduced.

Regrouping. A regrouping is the opposite of grouping. A regrouping operation is the process of separating a larger group matrix containing two or more circuit matrices into two or more matrices in association with adaptive partitioning. When two or more circuits within a group circuit become loosely coupled to each other during simulation, it creates less communications between the circuits and thus requires less number of computational iterations in simulation if the two or more circuits are separated. Therefore, it is more beneficial to simulate the circuits separately because smaller matrices may be used to solve the corresponding circuits, which results in less computations and less memory usage.

Local Accepted Time. A local accepted time is a local time stamp which a simulation solution is accepted for a particular circuit. The circuit is then solved out to the local accepted time, and the solution is assumed acceptable unless an event comes. The local current time becomes local accepted time if no event comes. This time parameter is used for synchronizing communications of information between circuits. Simulations of the particular circuit may resume from the local accepted time, but may not resume before this time stamp.

Local Current Time. A local current time is a calculated time in the future where the next scheduled simulation may start for a particular circuit. This time parameter is used for synchronizing communications of information between circuits. The local current time may be modified based on the new information received from other circuits until it becomes the local accepted time.

Global Accepted Time. A global accepted time is the maximum of all local accepted times of corresponding group circuits. This time parameter is also used for synchronizing communications of information between circuits. The simulation of the group circuits may resume from this point, but may not resume before this time stamp.

Global Current Time. A global current time is the minimum time of all the local current times of corresponding group circuits. This time parameter is also used for synchronizing communications of information between circuits. The global current time may be modified based on the new information received from other group circuits until it becomes the next global accepted time.

Circuit Simulator. The circuit simulator, also referred to as the simulator module, is the overall controller of the simulation. It is responsible for scheduling and managing the time for group circuits to be computed during the simulation. The simulator initiates the processing of active, isomorphic and adaptive events. It also initiates the creation of dynamic data structures for solving the group circuits in the active, isomorphic and adaptive event lists.

Simulation Structure and Databases

Figure 7:
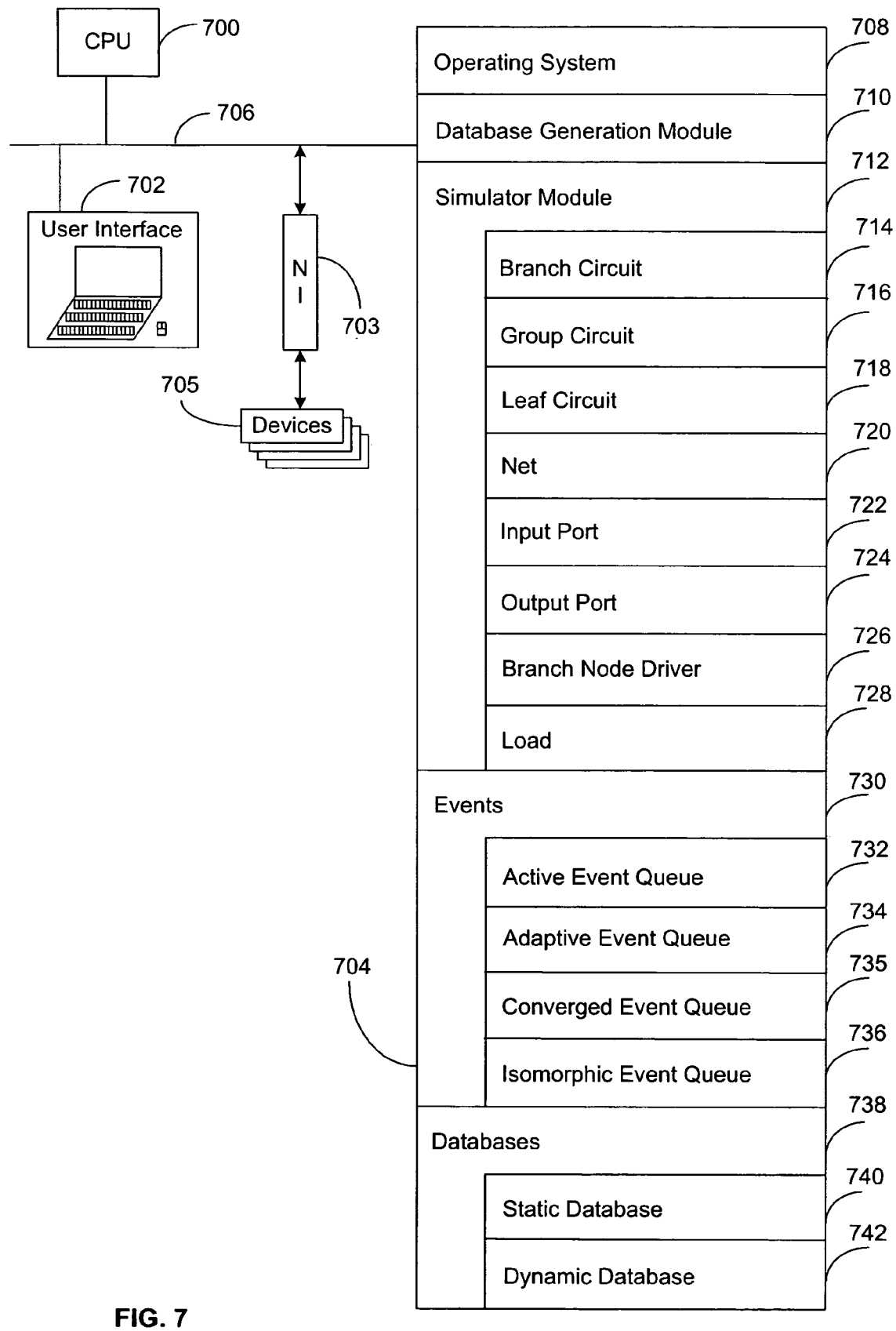
FIG. 7 illustrates an implementation of the circuit simulator using a computer system.

In one embodiment, a circuit simulator is implemented using a computer system schematically shown in FIG. 7. The computer system includes one or more central processing units (CPU's) 700, at least a user interface 702, a memory device 704, a system bus 706, and one or more bus interfaces for connecting the CPU, user interface, memory and system bus together. The computer system also includes at least one network interface 703 for communicating with other devices 705 on a computer network. In alternate embodiments, much of the functionality of the circuit simulator may be implemented in one or more application specific integrated circuits (ASICs) or field-programmable gate arrays (FPGAs), thereby either eliminating the need for a CPU, or reducing the role of the CPU in simulating the hierarchical integrated circuit.

The memory 704 may include high speed random access memory and may also include non-volatile memory, such as one or more magnetic disk storage devices. The memory 704 may also include mass storage that is remotely located from the central process unit(s) 700. The memory 704 preferably stores:

an operating system 708 that includes procedures for handling various basic system services and for performing hardware dependent tasks;

a database generation module 710 for generating a static database and a dynamic database for simulation;

a simulator module 712, for controlling the overall flow of the simulation, the simulator module employs a number unique data structures such as the branch circuit 714, the group circuit 716, the leaf circuit 718, the port connectivity interface 720, the input port 722, the output port 722, the branch node driver 726 and the load 728, to improve the performance and reduce the memory usage during the simulation;

an event queue 730 for storing all the scheduled events to be solved by the simulation, the events are retrieved from the event queue during simulation to form the following event lists:

an active event list 732 for storing events that need the current attention of the simulator to solve for a solution;

an adaptive event list 734 for storing events that need the attention of the simulator to reconstruct the matrix representation of the circuits for better simulation efficiency;

a converged event list 735 for storing the events that have been successfully solved and obtained a converged solution;

an isomorphic event list 736 for storing events that may need to split or merge due to changes in isomorphic properties of the circuits;

databases 738 for storing specific information of the integrated circuit for simulation, the databases contain the following two main parts:

a static database 740 for storing the topology information of the hierarchical data structure of the circuit under simulation;

a dynamic database 742 for storing dynamic information during simulation such as port connectivity interface, group circuits, dynamic state vectors, and other intermediate circuit simulation results.

The database generation module, the simulator module, the static database and the dynamic database may include executable procedures, sub-modules, tables and other data structures. In other embodiments, additional or different modules and data structures may be used, and some of the modules and/or data structures listed above may not be used.

Figure 8A:
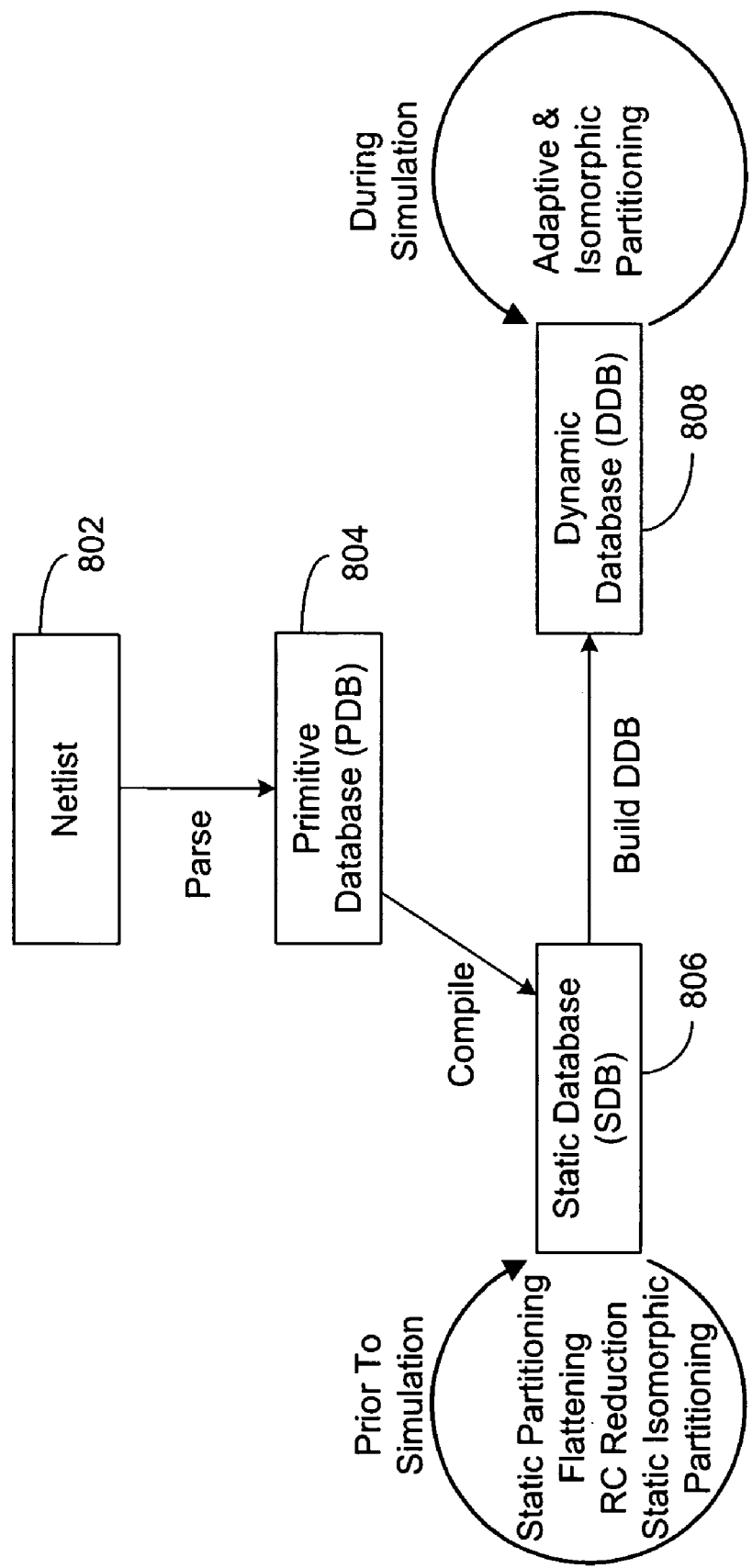
FIG. 8A illustrates a process for creating a static database and a dynamic database for circuit simulation.

FIG. 8A illustrates a process for creating a static database and a dynamic database for circuit simulation. The process starts with a SPICE netlist at block 802, a parser reads the SPICE netlist and creates a primitive database 804. The primitive database 804 contains the circuit components, and primitives of the corresponding circuit components of the netlist 802. Since the circuit components are usually parameterized, a compilation step is performed on the primitive database to annotate the primitives with their actual parameters and creates a set of actual instances. These instances are stored in the static database 806 having one element per unique parameter set. From the static database 806, a dynamic database 808 is built.

Prior to simulation, several initial setup processes are performed on the static database 806. The processes include static partitioning, flattening, pushouts, resistor-capacitor (RC) reduction, and static isomorphic partitioning. The process of static partitioning identifies the topology information of a circuit, including all the components in a circuit, the input and output ports of each circuit component, and the connections among the circuit components through their corresponding input and output ports. The flattening process combines certain circuit components together as one flattened circuit because it is more efficient to simulate them together without the hierarchical structure. Since the circuit simulator is capable of simulating hierarchical data structures, this step is performed only on selective parts of the circuit. The process of pushout separates components in a circuit which are independent of each other. In addition, the pushout process identifies certain components that may be shared with other circuits, and creates a hierarchical data structure for facilitating the sharing of common circuit components. The process of RC reduction is typically applied to a post layout netlist which contains many RC elements after the step of parasitic extraction for annotating the design. The procedure identifies each RC network as an n-port linear system, and produces an electrically equivalent n-port representation of the corresponding RC network with fewer states and elements that may be represented with smaller matrices. The process of isomorphic static partitioning combines circuit components that share substantially the same topology and parameters. For instance, if two inverters shares the substantially the same topology and parameters, these two inverters are represented as one inverter at the initial stage of the simulation.

Prior to simulation, a dynamic database 808 is created to include branch circuits for referencing the topology information in the static database 806. Each branch circuit provides references to other branch circuits and/or leaf circuits. During simulation, the dynamic state information of a specific group of circuits and their corresponding data structures are created in the dynamic database. In addition, optimizations on the dynamic state information, such as the process of merging and splitting in association with the isomorphic partitioning and the process of grouping and regrouping in association with adaptive partitioning, are performed during simulation. The process of merging and splitting, and the process of grouping and regrouping are described in detail in the following sections.

Figure 8B:
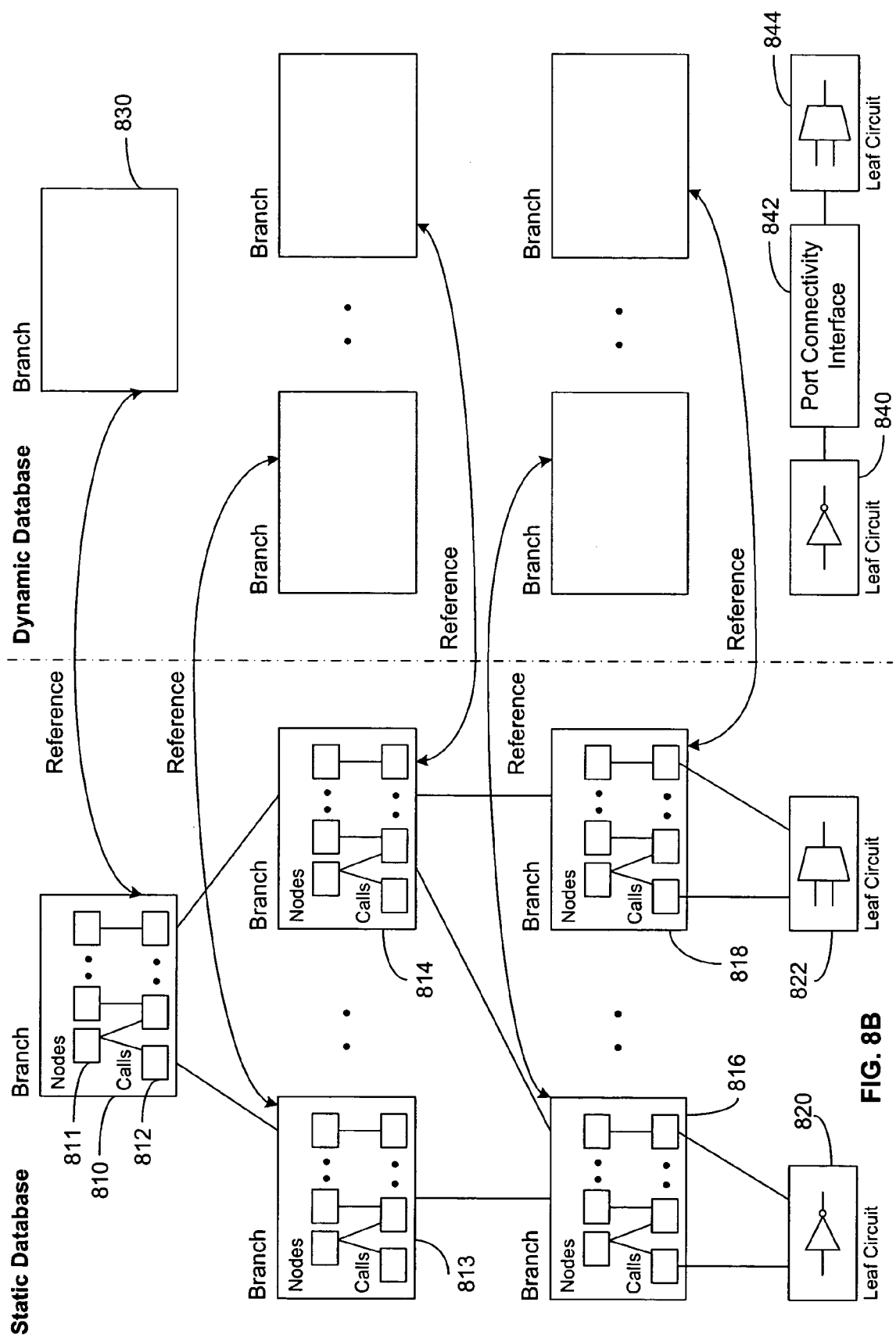
FIG. 8B illustrates a structural view of the information contained in the static database and the dynamic database.

FIG. 8B illustrates a structural view of the information contained in the static database (SDB) and the dynamic database (DDB). In FIG. 8B, there are four levels of hierarchy. The left side shows the static database where each static branch circuit 810 contains one or more nodes 811 and one or more static calls 812. Each static call is a reference to another static branch circuit or to a static leaf circuit. From the perspective of a node, it connects a driver circuit (through a static call) to a receiver circuit (through a different static call). There may be one driver and multiple receivers per node. The top level static branch circuit 810 contains static calls to the static branch circuits 813 and 814 at the next level. Likewise, the static branch circuits 813 and 814 contain static calls to the static branch circuits 816 and 818 at a level below. A static branch circuit may be called multiple times by another static branch circuit at a higher level. The level that contains leaf circuits such as 820 or 822 is sometimes referred to as the solution layer, which is typically at the lowest level of the hierarchy. A leaf circuit may be referenced by multiple static calls from different levels.

In the dynamic database, a mirror image of each corresponding static branch circuit of the static database is created. As shown in the right hand side of FIG. 8B, this dynamic database also contains 4 levels of dynamic branch circuits. The top level dynamic branch circuit 830 references to the top level static branch circuit 810. Similarly, each dynamic branch circuit references to its corresponding static branch circuit in the static database, as indicated by the arrows between two corresponding branch circuits in the static database and the dynamic database. This reference is important because the static database contains all the topology information of the circuit under simulation. For example, when it is necessary to perform a split operation, the topology information in the static database is retrieved to create a duplicate of a particular group circuit referenced by a call in the dynamic database. Similarly, the level that contains leaf circuit such as 840 or 844 is sometimes referred to as the solution layer, which is typically at the lowest level of the hierarchy. During simulation, the leaf circuits, such as 840 and 844 may be grouped into a group circuit. A group circuit is a dynamic data structure which provides temporary storage of at least one or more leaf circuits. A group circuit is distinguished from a branch circuit that it contains one or more leaf circuits and it does not contain connectivity information of the leaf circuits. A group circuit is associated with a group solver for solving the matrix associated with the group circuit. A group circuit also includes reference to an event, which supports adding and deleting circuits in the group dynamically in response to changes in signal conditions during simulation. Another distinguishing element of the dynamic database is the port connectivity interface 842, which facilitates communications between two or more leaf circuits. As described in the following sections, the port connectivity interface provides an efficient channel for communicating information between two leaf circuits in two different branches of a hierarchical data structure during simulation without traversing through the hierarchy.

Simulation Flow

Figure 9A:
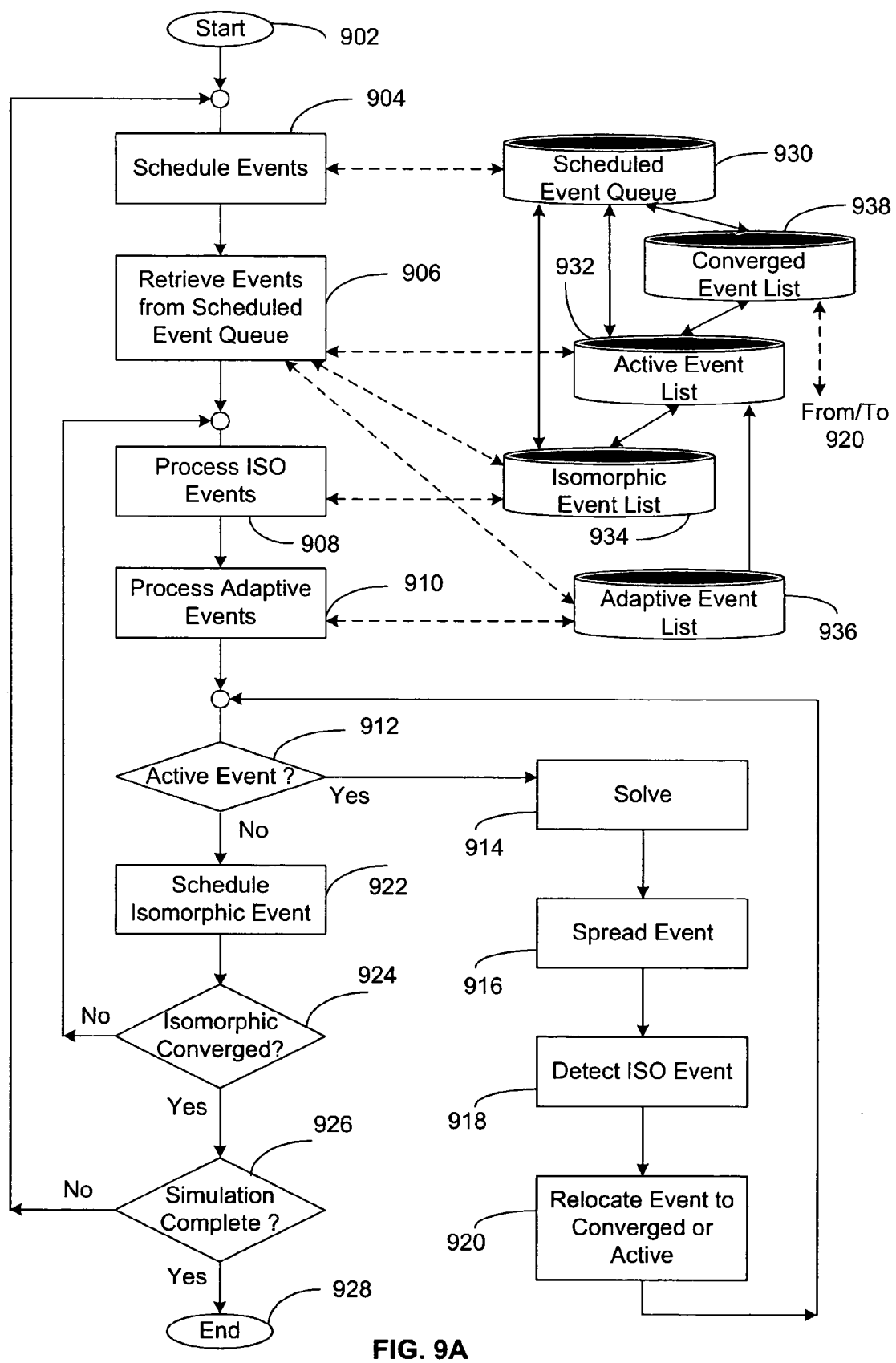
FIG. 9A illustrates a method for controlling the simulation flow by the simulator.

FIG. 9A illustrates a method for controlling the simulation flow by the simulator. The simulator uses an event framework to communicate information exchanges between group circuits. The method starts in block 902 and thereafter moves to step 904 where the simulator schedules events to be processed and stores the scheduled events in a scheduled event queue 930. In the beginning of a simulation, each group circuit has an accepted DC solution at time 0, and each group circuit is scheduled a corresponding event to be processed by the simulator. Next, in step 906, the simulator retrieves events from the scheduled event queue 930 and distributes each event retrieved to one of the temporary event storage lists, namely an active event list 932, an isomorphic event list 934 or an adaptive event list 936 in accordance with the characteristics of each event.

In step 908, the simulator initiates the processing of the isomorphic event list 934. The simulator first retrieves the isomorphic event list 934 from the active event list 932. A method for processing isomorphic event is described in detail in association with the description of FIGS. 9B-C below. Upon processing the isomorphic event list 934, the newly processed events are stored back in the active event queue 932. In step 910, the simulator processes the adaptive event list 936. The simulator reconstructs the group circuit by examining whether the circuits within the group are closely or loosely coupled. The simulator may combine matrices of closely coupled circuits into a larger group matrix in order to minimize external communications of changes of signal conditions between the circuits. The simulator may also separate a larger group matrix containing loosely coupled circuits into two or more circuit matrices for computation. A method for processing an adaptive event is described in detail in association with FIGS. 10A-C and FIG. 11 below. Upon processing the adaptive event list 936, the group events are stored back in the active event queue 932.

In step 912, a first determination is made as to whether there are any active events at the current accepted time. If there is no active event (912-No), the NO path is taken and the method goes on to step 922. In the alternative, if there is an active event (912-Yes), the YES path is taken and the method continues at step 914 where the simulator calls a matrix solver to solve the group circuit. Upon solving the group circuit in step 914, the simulator spreads the solution (events) to neighbors in step 916 if the port changes are significant. There are two ways to spread an event: the first way is called forward communication and the second way is called reverse communication as described in FIG. 12A below. In step 918, the simulator examines whether there is an isomorphic event in the near future due to the changes in signal conditions at ports generated by the new solution. The simulator performs this function by determining the divergence of a solution based on the current solution point and its rate of change. In some embodiments, this determination may be achieved by linear interpolation, linear extrapolation or any higher order approximations. If there is a potential isomorphic event in the near future, the simulator communicates this isomorphic event. For example, the simulator performs a forward communication of changes of signal conditions at an output port of a driver leaf circuit to the input ports of receiver leaf circuits. Similarly, the simulator also performs a reverse communication of changes of signal conditions at an input port of a receiver leaf circuit to the load of a driver leaf circuit. Note that both the forward and reverse communications may create additional isomorphic events. In step 920, the simulator relocates the solved group circuit to either a converged event queue 938 if the solution to the group circuit has converged or to the active event queue 932 if the solution to the group circuit has not yet converged and further computational iterations are needed to solve the particular group circuit. The process then repeats at step 912.

In step 922, the simulator schedules isomorphic events. In general, isomorphic events are not scheduled immediately after computing a solution for a group circuit, since an isomorphic event may be modified multiple times during a single time step within a computational loop. For this reason, the isomorphic events are collected in a special event list in the event manager. This list is traversed during the isomorphic event scheduling step and the events are rescheduled at that time according to the priority of their corresponding event times. In an alternative embodiment, the simulator may also leave the events in the isomorphic event list 934 and create immediate events. In that approach, the simulator may trigger another immediate iteration without time advancement.

In step 924, a second determination is made as to whether the isomorphic events have converged. If not (924-No), the NO path is taken and the process repeats at step 908. Otherwise, if the isomorphic events have converged (924-Yes), the YES path is taken and the method continues at step 926 where a third determination is made as to whether the simulation has completed. If the simulation has not completed (926-No), the NO path is taken and the simulator moves to step 904 and it schedules converged events for computation at a time step in the future. In the alternative, if the simulation has completed at step 926 (926-Yes), the YES path is taken and the method ends at block 928.

Dynamic Isomorphic Partitioning

Dynamic isomorphic partitioning is a process for identifying and combining circuits which have 1) substantially the same waveforms at the input ports of the circuits; 2) substantially the same loads at the output ports of the circuits; and 3) substantially the same states (signal conditions) during a particular period of interest. For example, during simulation, if two circuits diverge from each other over time, the simulator splits the isomorphic representation of the two circuits and creates two new dynamic circuits to represent each individual circuit in a different dynamic state. During another period of the simulation, if the isomorphic behavior of the two circuits becomes substantially the same, the simulator merges them together and represents the two circuits with a newly created isomorphic circuit. The simulator detects and monitors isomorphic events that may have diverged outside a predefined tolerance level and reconstructs the group circuit and its corresponding dynamic data structures accordingly. To detect an isomorphic event, a share manager is utilized to locate the functional calls in a higher level of the hierarchical data structure that references the leaf circuits. In other words, the share manager may have the capability to access the connectivity information from a leaf through the functional calls at a branch circuit. In an alternative embodiment, the share manager may have a secondary data structure which is capable to keep a list of functional calls to a group circuit by calling its parent.

FIG. 9B illustrates a method for processing an isomorphic event in step 908 of FIG. 9A. The method starts in block 940 and thereafter moves to step 942 where the simulator accepts time from all circuit groups. In step 944, the simulator removes individual circuits contained in each group and put them in a temporary pool of circuits. Then, in step 946, the simulator performs split, merge and/or regroup operations on the temporary pool of circuits where necessary. Upon successfully completed the split, merge, and/or regroup operations, in step 948, the simulator creates new circuit groups for the newly processed circuits from step 946. In step 950, the simulator creates new port connectivity interfaces in response to each new group circuit (event) formed in step 948. In step 952, the simulator moves the newly formed group circuits (events) to the active event list 932 or the isomorphic event list 934. The method ends in step 954.

FIG. 9C illustrates a process of isomorphic partitioning. Prior to the start of a simulation, if two substantially the same leaf circuits 1 and 2 which demonstrate substantially the same isomorphic behavior, they are merged and represented by a single group matrix 960. Note that two leaf circuits are deemed to have substantially the same isomorphic behavior if 1) a substantially same set of input signals are received by the two leaf circuits; 2) a substantially same set of internal topologies, internal states, and external loads are observed by the two leaf circuits; and 3) a substantially same set of output signals are produced within a predetermined threshold of signal tolerance by the two leaf circuits in response to the substantially same set of input signals. During certain period of the simulation, if the leaf circuits 1 and 2 diverge from each other and demonstrate substantially different isomorphic behavior, then a split operation is performed on the leaf circuit represented by the group matrix 960 to separate it into two individual leaf circuits represented by the group matrices 962 and 964 respectively. Note that two leaf circuits are deemed to have substantially different isomorphic behavior if 1) a substantially different set of input signals are received by the two leaf circuit; 2) a substantially different set of internal topologies, internal states and external loads are observed by the two leaf circuits; or 3) a substantially different set of output signals are produced within a predetermined threshold of signal tolerance by the two leaf circuits in response to a substantial same set of input signals. Upon creation of the new group matrices 962 and 964 by the split operation, the group matrix 960 is deleted from the dynamic database. During another period of the simulation, if the isomorphic behavior of the leaf circuit 1 and 2 converge to each other and demonstrate substantially the same isomorphic behavior again, a merge operation is performed to combine the two individual leaf circuits represented by the group matrices 962 and 964 respectively into a single leaf circuit represented by the group matrix 960. Upon creation of the group matrix 960 by the merge operation, the group matrices 962 and 964 are deleted from the dynamic database. This process of isomorphic partitioning minimizes the number of circuits used to represent the design during simulation and hence minimizes the corresponding computation of the circuits when such circuits demonstrate substantially the same isomorphic behavior.

Adaptive Partitioning

Figure 10A:
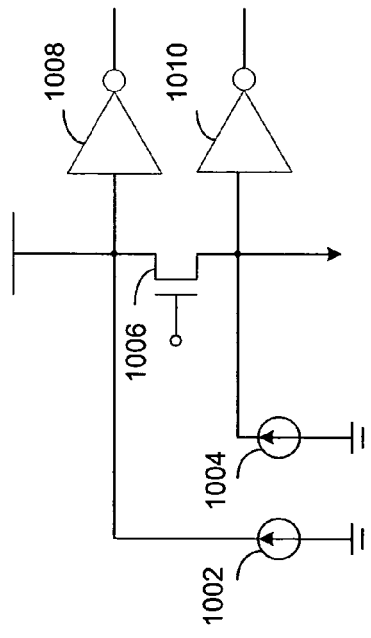
FIG. 10A illustrates an exemplary circuit under simulation.
Figure 10B:
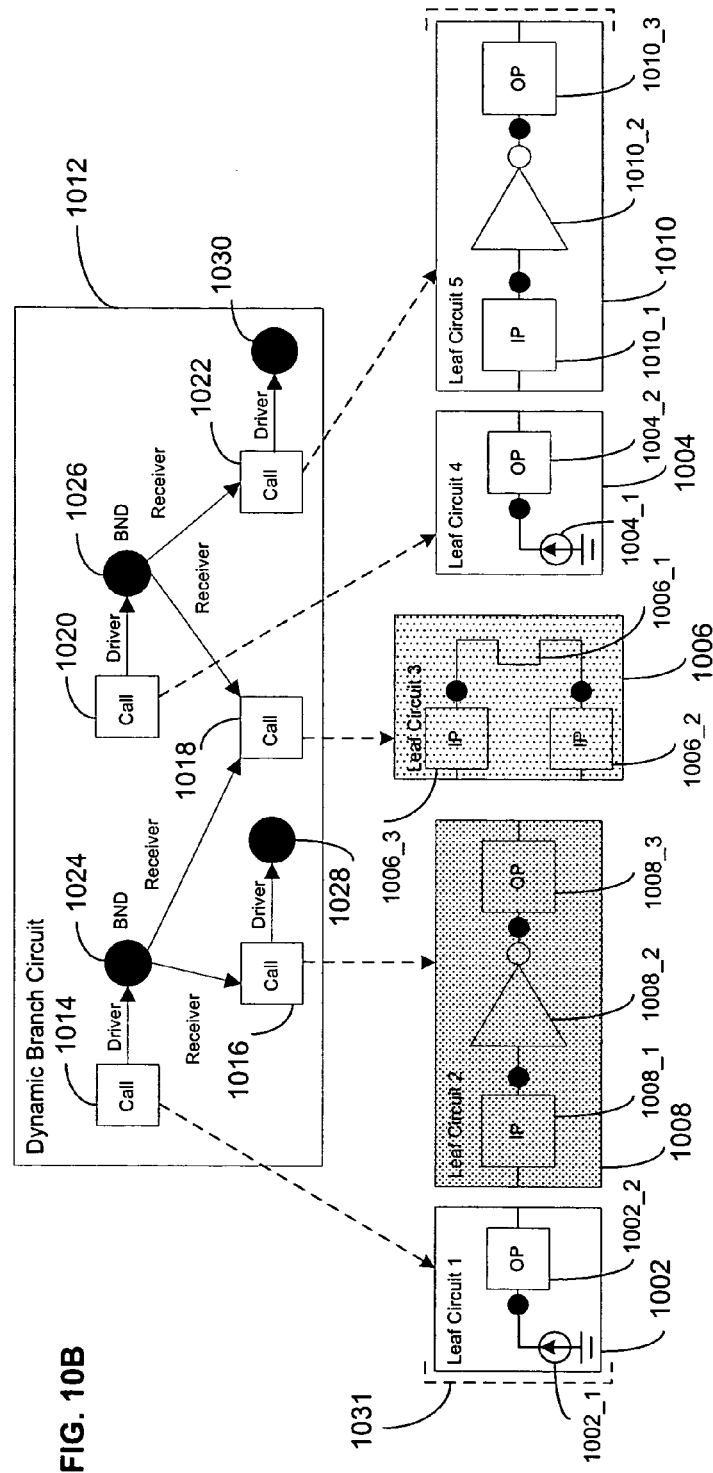
FIG. 10B illustrates the exemplary circuit of FIG. 10A as a dynamic branch circuit.
Figure 10C:
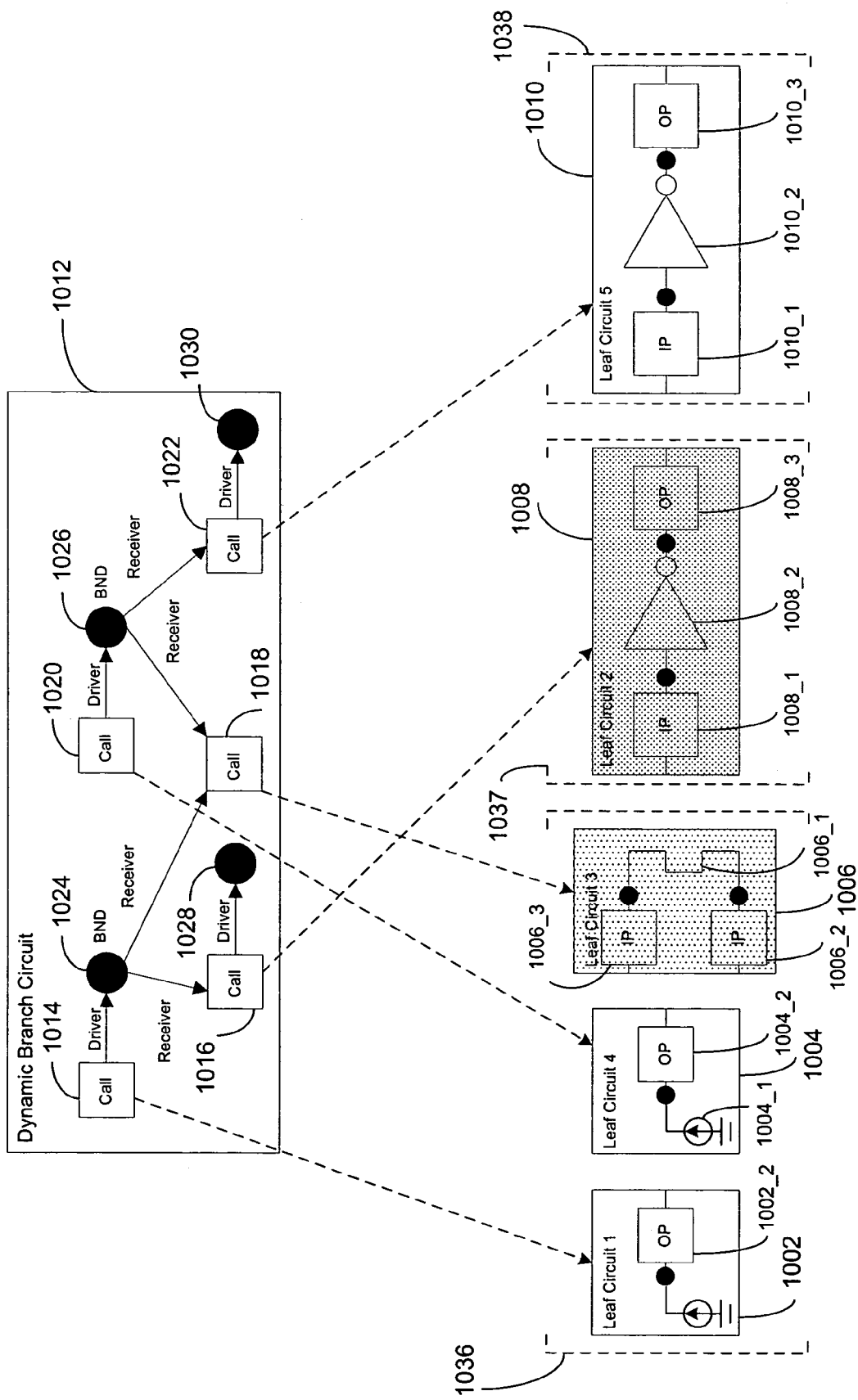
FIG. 10C illustrates a process of adaptive partitioning of the dynamic branch circuit of FIG. 10B during simulation.

The process of adaptive partitioning is performed in step 910 of FIG. 9A. FIGS. 10A, 10B and 10C together illustrate a method for performing adaptive partitioning. FIG. 10A illustrates an exemplary circuit under simulation. This circuit includes five partitions: a first current source 1002, a second current source 1004, a transistor 1006, a first inverter 1008 and a second inverter 1010. The first current source 1002 has a first terminal coupled to a circuit ground, and a second terminal coupled to a drain terminal of the transistor 1006 and to an input terminal of the first inverter 1008. The second current source 1004 also has a first terminal coupled to the circuit ground, and a second terminal coupled to a source terminal of the transistor 1006 and an input terminal of the second inverter 1010. The input terminals of the first inverter 1008 and the second inverter 1010 are separated by the transistor 1006.

FIG. 10B illustrates the exemplary circuit of FIG. 10A as a dynamic branch circuit. The dynamic branch circuit 1012 includes a first call 1014 to a leaf circuit 1 representing the first current source 1002, a second call 1016 to a leaf circuit 2 representing the first inverter 1008, a third call 1018 to a leaf circuit 3 representing the transistor 1006, a fourth call 1020 to a leaf circuit 4 representing the second current source 1004 and a fifth call 1022 to a leaf circuit 5 representing the second inverter 1010. The leaf circuit 1 includes the first current source 1002_1 and its output port (OP) 1002_2. The leaf circuit 2 includes an input port (IP) 1008_1, an inverter 1008_2 and an output port (OP) 1008_3 connected in series. The leaf circuit 3 includes a transistor 1006_1 coupled between a first input port 1006_2 and a second input port 1006_3. The leaf circuit 4 includes the second current source 1004_1 and its output port 1004_2. The leaf circuit 5 includes an input port 1010_1, an inverter 1010_2, and an output port 1010_3 connected in series. As shown in FIG. 10B, the leaf circuit 1 1002 drives the leaf circuit 2 1008 and a first input port of leaf circuit 3 1006_2 through a first branch node driver (BND) 1024, and the leaf circuit 2 in turn drives a first output port 1028. Similarly, the leaf circuit 4 1004 drivers the leaf circuit 5 1010 and a second input port of leaf circuit 3 1006_3 through a second branch node driver (BND) 1026, and the leaf circuit 5 in turn drives a second output port 1030. The leaf circuits 1002, 1004, 1006, 1008 and 1010 may be represented in a group circuit 1031 as shown in the dotted-line brackets. These leaf circuits may be simulated individually initially and the corresponding computation solutions from any one leaf circuit may be communicated both in forward and reverse directions to the related leaf circuits. As described next, adaptive partitioning of the leaf circuits are performed when the electrical connectivity between the leaf circuits changes during simulation.

FIG. 10C illustrates a process of adaptive partitioning of the dynamic branch circuit of FIG. 10B during simulation. When the coupling between circuits changes during simulation, the simulator adaptively creates new circuit groups to reflect such changes in connectivity between circuits. In general, circuits which are strongly coupled to each other are grouped together in this process. In one embodiment, when the transistor 1006 switches from off to on, the coupling between the drain terminal and the source terminal becomes strong. This change in electrical coupling between the two terminals of the transistor causes the leaf circuit 1 1002 and leaf circuit 4 1004 become tightly coupled to one another. Therefore in FIG. 10C, a new group 1036 is figuratively created, which includes the leaf circuit 1 1002, leaf circuit 4 1004 and leaf circuit 3 1006 of FIG. 10B. In the newly formed group circuit 1036, the output port 1002_2 of the first current source 1002 is coupled to the first input port 1006_3 of the transistor 1006 and the output port 1004_2 of the second current source 1004 is coupled to the second input port 1006_2 of the transistor 1006. Both the current sources and the transistor are simulated together in a newly formed matrix containing all three individual leaf circuits. The leaf circuits 2 and 5 remain the same as in FIG. 10B and they are represented by the group circuits 1037 and 1038. Note that the nodes of the dynamic branch circuit are not moved within the partitions. These nodes continue to exist within their actual dynamic branch circuits. This is because these nodes are used in case of repartitioning or in case of splitting partitions.

There are two main factors in determining whether it is more efficient to compute each of the leaf circuit individually or combine the leaf circuits together in a larger matrix: 1) the size of the matrix; and 2) the number of computational iterations required for the simulation solution to converge. Generally, a large matrix requires more computation cycles to solve than a small matrix. However, if two leaf circuits are closely coupled, frequent communications between the leaf circuits may result in many computational iterations during simulation. Under such circumstance, the simulator may need to monitor, generate and communicate changes in signal conditions from one leaf circuit to the other leaf circuit repetitively until a solution converges. The Newton-Raphson iteration is one technique that may be used for this repetitive simulation process. In other words, if two leaf circuits are tightly coupled to each other, it may be more efficient to combine them together and simulate them in a large matrix because the external communications of changes in signal conditions and their corresponding simulation iterations are eliminated. On the other hand, if two leaf circuits are loosely coupled to each other, it may be more efficient to simulate them separately in their respective matrices because the simulator may work with smaller matrices, and the simulator may take a different time step for each circuit best suited for reaching a solution.

Figure 11:
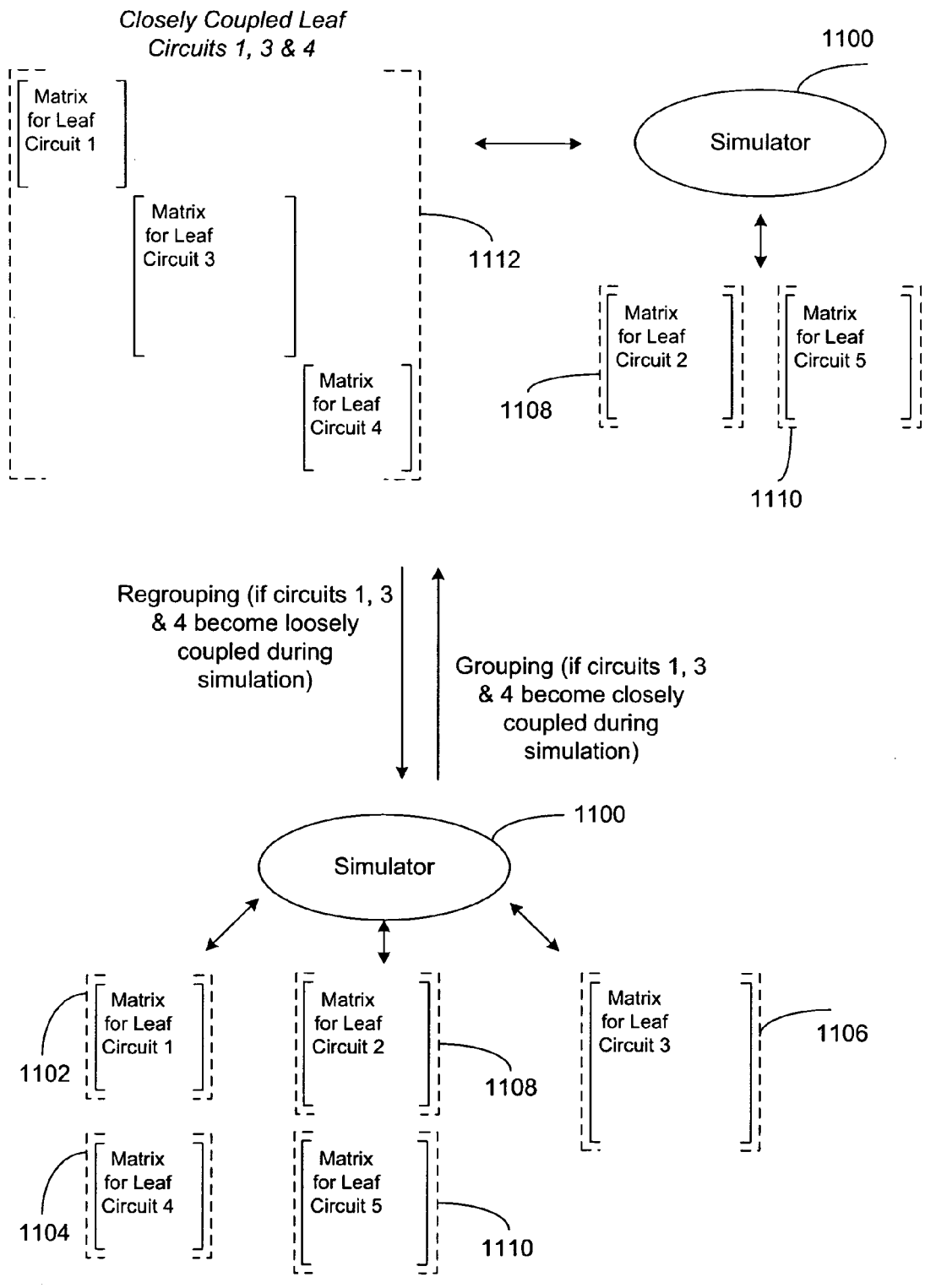
FIG. 11 illustrates a matrix representation of adaptive partitioning.

FIG. 11 illustrates a matrix representation of adaptive partitioning. The method examines the strength of coupling between leaf circuits and identifies an efficient arrangement of the corresponding matrices for computing a group circuit. Communications between group circuits are conducted through an event framework controlled by the simulator as described with respect to FIG. 9A. Initially, leaf circuit 1 represented by the matrix 1102, leaf circuit 3 represented by the matrix 1106, and leaf circuit 4 represented by the matrix 1104 are loosely coupled when the transistor represented by the matrix 1006 is off. Assuming that during simulation, if the transistor (leaf circuit 3) is turned on, which causes leaf circuits 1 and 4 become closely coupled to each other, then an adaptive partitioning may be performed on the leaf circuits and new group circuits are formed. The leaf circuits 1, 3 and 4 are grouped together to form a new group circuit represented by the matrix 1112. By grouping the leaf circuits 1, 3, and 4 together, communications between them through the event framework are no longer necessary because the communications are handled within the same group matrix. As a result, the number of computational iterations is reduced because the matrices for leaf circuits 1, 3, and 4 are solved in the same group matrix 1112. Hence, the overall simulation performance is improved because less computational iterations are required to reach a converged solution.

Note that in another period of the simulation, if the leaf circuits 1, 3 and 4 may become loosely coupled, the simulator regroups the leaf circuits and separates the group matrix 1112 into individual matrices 1102, 1104 and 1106 respectively.

Event Communication

An event communication scheme describes the communication between individually solved group circuit to other group circuits that may be affected by the communication. In general, each partition of a group circuit is associated with its own group solver. Since these partitions may still be connected, changes with respect to the individual nodes have to be addressed and communicated. This communication happens in both forward and backward directions between group circuits due to the bi-directional nature of a node.

Figure 12A:
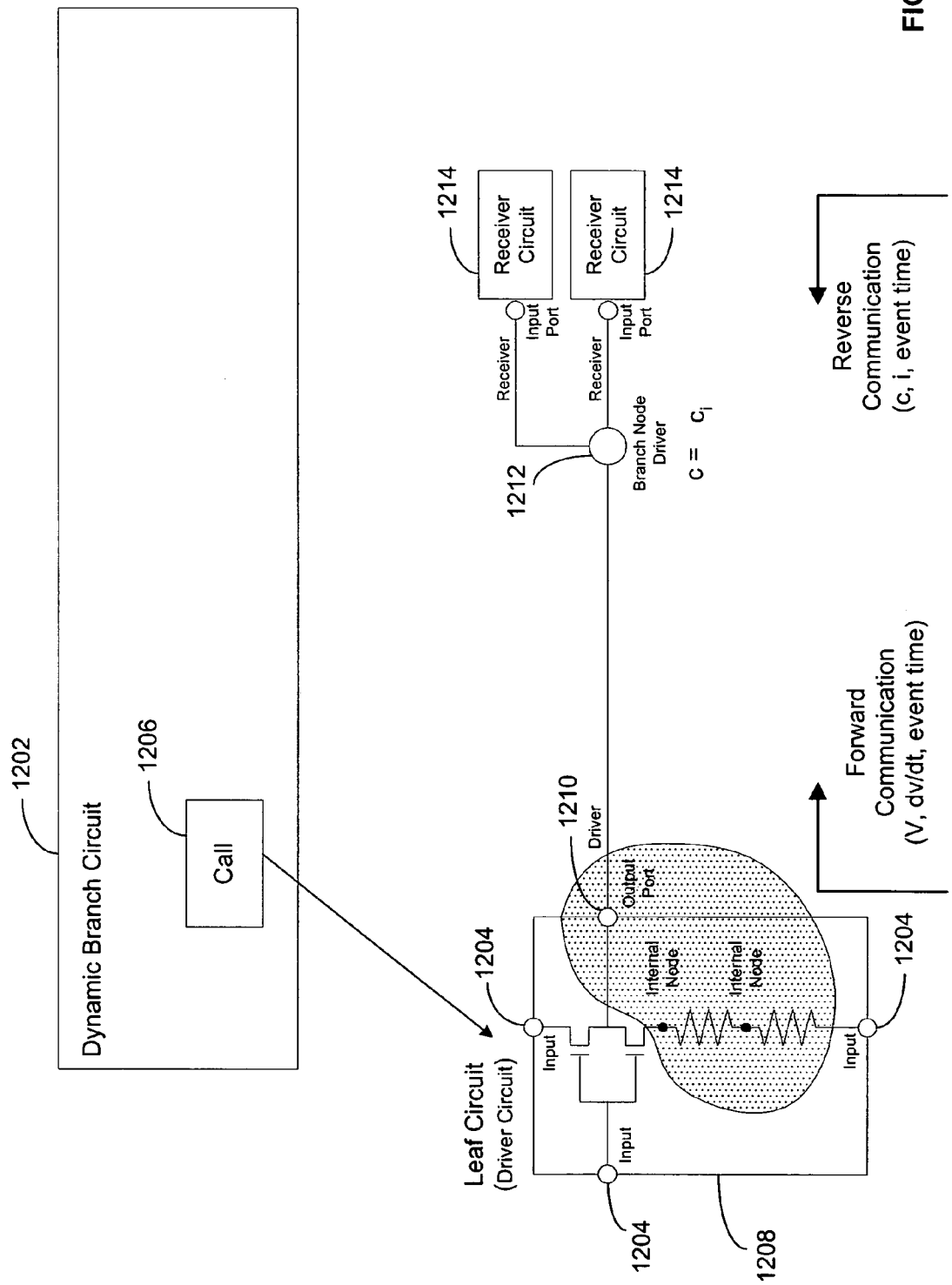
FIG. 12A illustrates forward and reverse communications of simulation events.

FIG. 12A illustrates forward and reverse communications of simulation events. As shown in FIG. 12A, an exemplary dynamic branch circuit 1202 in the hierarchical layer may include a call 1206 references to a corresponding leaf circuit 1208 in the solution layer. The leaf circuit 1208 may include one or more input ports 1204, one or more output ports 1210. The leaf circuit 1208 has three input ports and one output port. The solution layer may further include one or more branch node drivers (BND) 1212, and one or more receiver circuits 1214 coupled to the branch node driver 1212. For communication purposes, the input ports, output ports, branch node drivers and loads are data structures of interest. Internal nodes, although contain information about dynamic states of the leaf circuit, are irrelevant for the purpose of event communication. Note that a branch node driver is driven by an output port, and a branch node driver may drive multiple input ports of receiver circuits. The load of each branch node driver is the sum of all individual loads of input ports coupled to the branch node driver.

During simulation, when the signal conditions at an output port of a circuit change significantly such that these changes need to be broadcasted to its receivers, forward communications are initiated to inform the one or more receivers about the changes. The changes of signal conditions may include a voltage (v) of the output port, a rate of change voltage (dv/dt) of the output port, and an event time (t). Similarly, when the signal conditions at an input port of a receiver circuit have changed significantly, these changes also need to be broadcasted to the driver circuit through the loads of branch node drivers. Reverse communications are initiated to inform the driver circuit about the changes. A reverse communication may include a capacitance (c) of the input port, an admittance (g) of the input port, a current (i) at the input port and an event time. Since multiple input ports may be connected to a single branch node driver, the contribution of each input port to the total load at the branch node driver may be accumulated, and therefore the actual value of capacitance (c), admittance (g), and current (i) at the branch node driver 1212 is the sum of all contributions from the input ports of all receiver circuits coupled to the branch node driver 1212. Note that multiple branch node drivers may share a load if the input ports coupled to the branch node drivers are the same. Also note that each communication is time stamped with an event time for synchronizing an individual circuit to the rest of the circuits.

Figure 12B:
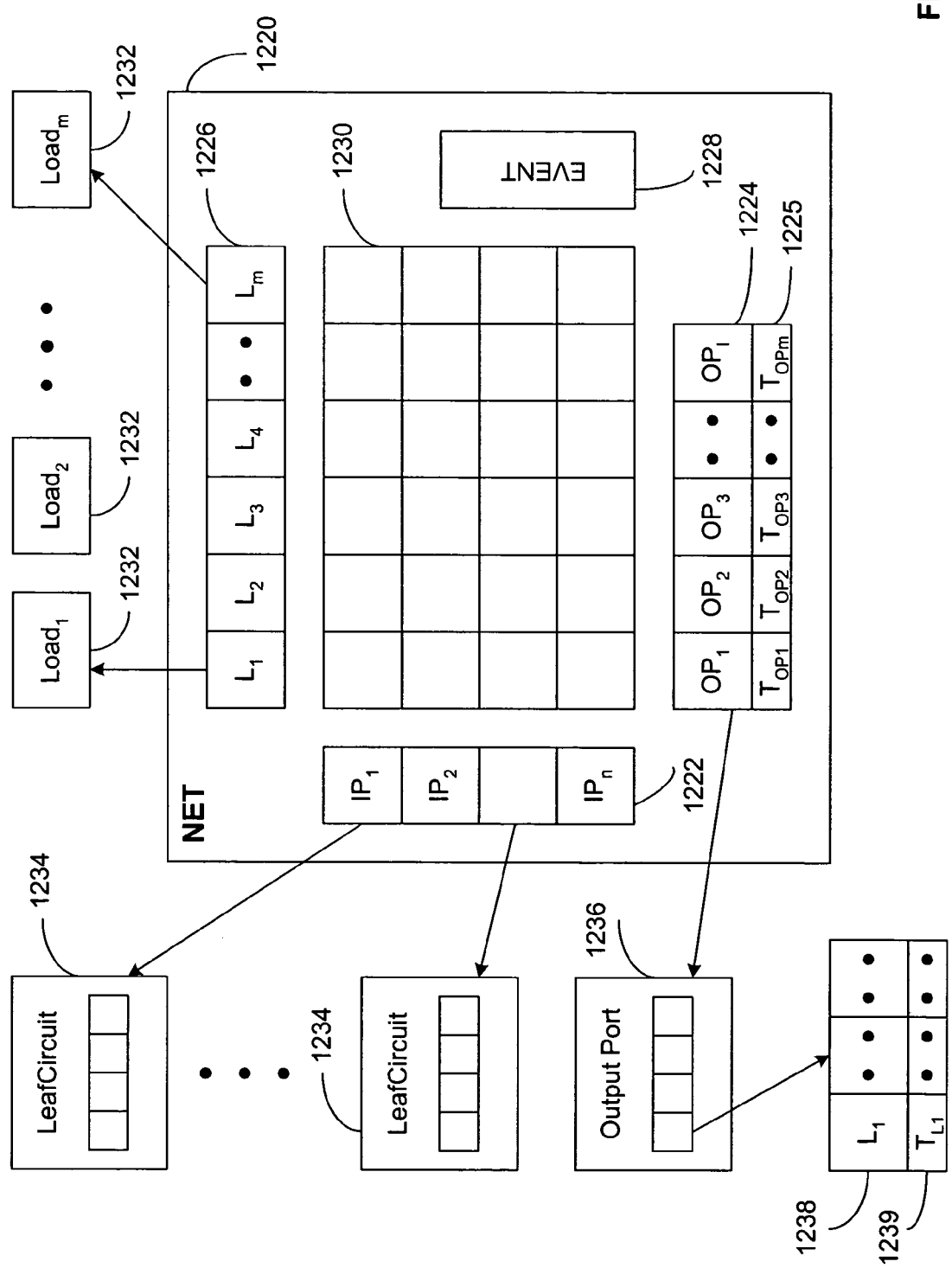
FIG. 12B illustrates a graphical representation of a port connectivity interface.

Communicating information in both forward and backward directions is conducted through output ports, input ports, loads, and port connectivity interfaces. For a forward communication, the output port, where the changes of signal conditions occur, finds destinations of the forward communication directly through one or more port connectivity interfaces to the corresponding input ports of receiver circuits. For a reverse communication, the input port, where the changes of signal conditions occur, finds destinations of the reverse communication directly through one or more port connectivity interfaces to the corresponding loads of branch node drivers. Each communication is achieved via output ports, input ports, loads and port connectivity interfaces and does not need to traverse the various levels of the hierarchical data structure. FIG. 12B illustrates a graphical representation of a port connectivity interface according to one embodiment of the disclosure. The port connectivity interface 1220 includes a list of input port (IP) vectors 1222, a list of output port (OP) vectors 1224, a list of load (L) vectors, an event pointer 1228, and an array for storing information about the number of times an input port is seen by each load. Each input port vector may refer to one or more input ports of leaf circuits 1234. Each output port vector may refer to an output port data structure 1236, which in turn may refer to one or more loads 1238 and their corresponding event time 1239. There is an event time 1225 associated with each output port vector 1224. The event time of the port connectivity interface 1220 is the minimum of all output port event times 1225. Each load vector may refer to one or more loads 1232. Each port connectivity interface or each output port contains an event for referencing to a particular group circuit. Similarly, each input port of a group circuit may refer to a port connectivity interface.

For detecting a forward isomorphic event, each output port in a port connectivity interface has a time value associated with it, which reflects the next isomorphic event time for this output port. In one embodiment, one of the output ports is chosen as a leader and all other output ports are followers. The list of output port vectors contains the leader output port and one or more follower output ports and their corresponding isomorphic event times. A follower event time is the time when the follower is estimated to diverge from the leader. In addition, since a shared port connectivity interface is associated with an isomorphic event, the port connectivity interface also contains an event pointer. The event pointer allows the event to be constructed and allocated in case when there is a need to share the port connectivity interface. Detecting reverse isomorphic event is similar to that of detecting a forward isomorphic event. Therefore, a reverse isomorphic event also has to know about potential event times of all shared loads. For this reason, the shared loads of an output port are associated with their potential isomorphic event times. Similar to the port connectivity interface, a shared output port also contains an event pointer, a leader and a set of followers.

Figure 12C:
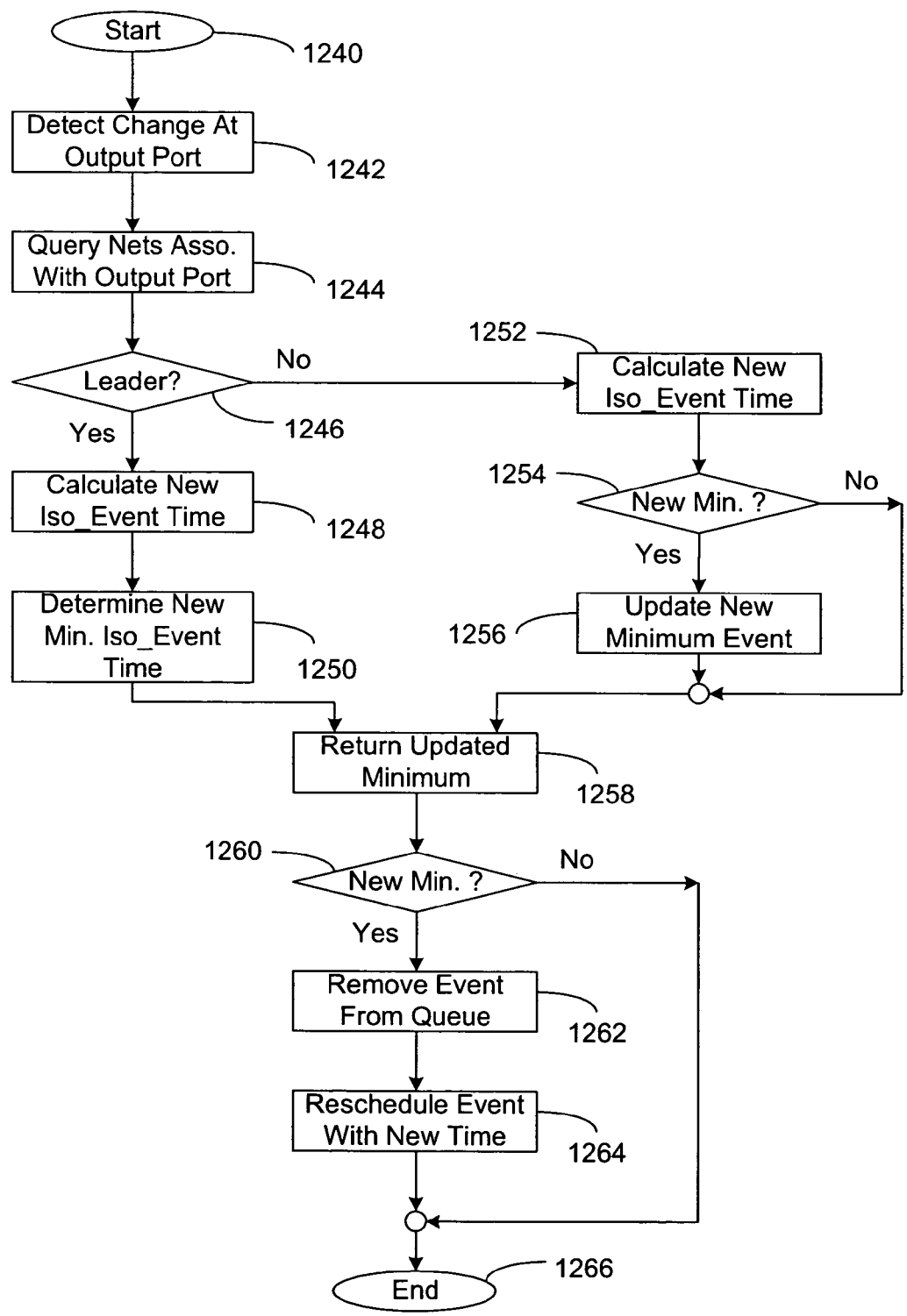
FIG. 12C illustrates a method for determining an event time for a forward communication.

FIG. 12C illustrates a method for determining an event time for a forward communication. The method starts in block 1240 and thereafter moves to step 1242 where the method detects changes in signal conditions at an output port of a driver circuit. Once sufficient signal changes are detected at the output port to justify a forward communication, in step 1244, each port connectivity interface associated with the output port is queried for isomorphic event activity with respect to the given output port. In step 1246, a first determination is made as to whether the output port is a leader. If the output port is a leader (1246-Yes), the YES path is taken and the method calculates new isomorphic event times for all output ports in step 1248 and determines a new minimum isomorphic event time in step 1250. In the alternative, if the output port is a follower (1246-No), the NO path is taken and the method calculates a new isomorphic event time for this follower output port in step 1252. In step 1254, a second determination is made as to whether the minimum isomorphic event time has changed. If the minimum isomorphic event time has changed (1254-Yes), the YES Path is taken and the method updates the minimum isomorphic event time in step 1256. In the alternative, if the minimum isomorphic event time has not changed (1254-No), the NO path is taken and the method continues at step 1258. In step 1258, the method returns the newly updated minimum isomorphic event time. In step 1260, a third determination is made as to whether the minimum isomorphic event time returned by the procedure is less then the currently scheduled minimum isomorphic event time for the port connectivity interface isomorphic event. If the minimum isomorphic event time returned by the procedure is less than the currently scheduled minimum isomorphic event time (1260-Yes), the YES path is taken and this isomorphic event is removed from the queue in step 1262 and the isomorphic event is rescheduled with the new event time in step 1264. Else if the minimum isomorphic event time returned by the procedure is not less than the currently scheduled minimum isomorphic event time (1260-No), the currently scheduled minimum isomorphic event time remains the same and the method ends in step 1266.

Figure 12D:
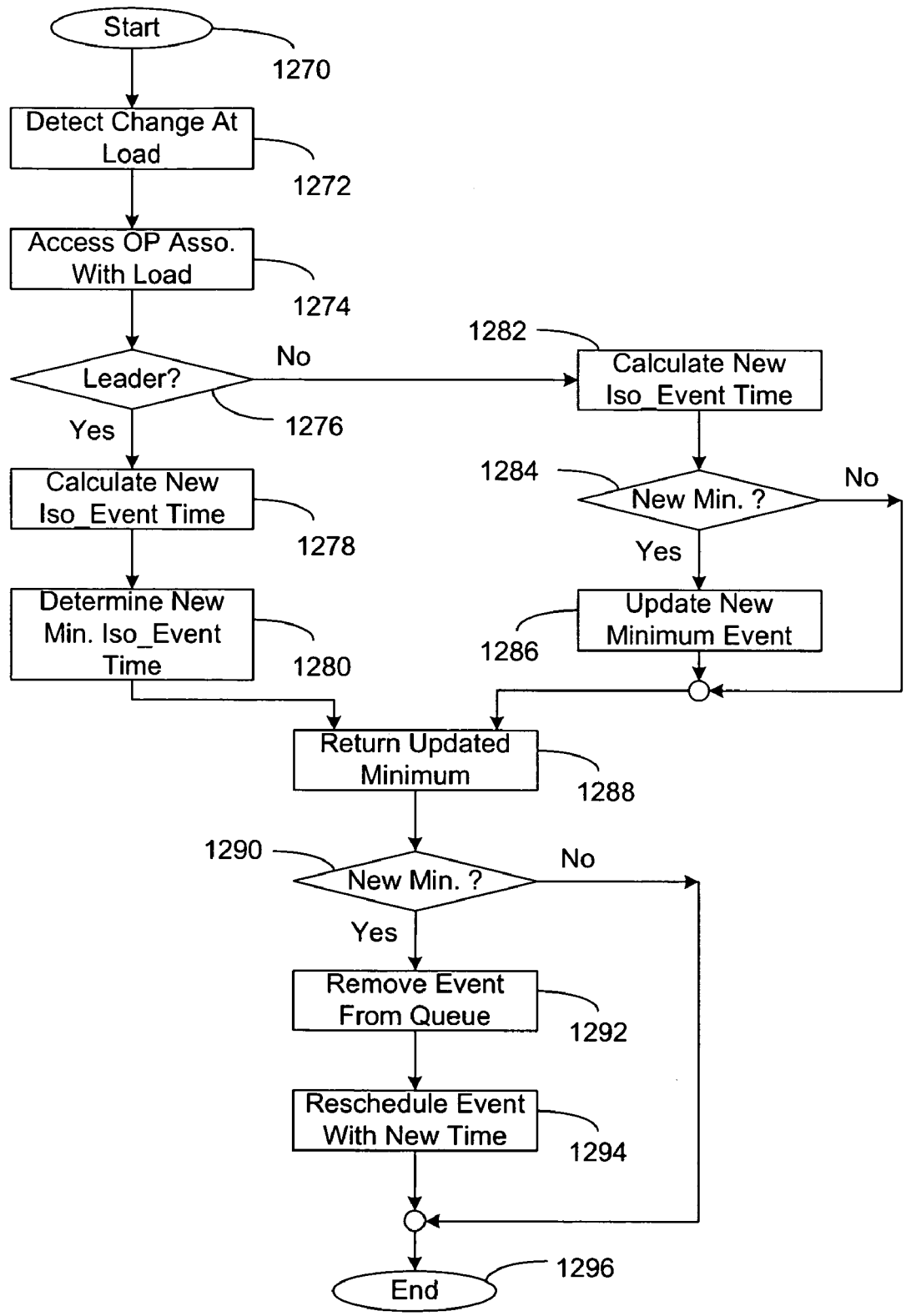
FIG. 12D illustrates a method for determining an event time for a reverse communication.

FIG. 12D illustrates a method for determining an event time for a reverse communication. Similar to the forward communication, the reverse communication is performed while spreading events. The method starts in block 1270 and thereafter moves to step 1272 where the method detects changes in signal conditions at an input port of a receiver leaf circuit. Whenever there are changes in signal conditions at an input port, these changes may need to be communicated from the input port of the receiver leaf circuit to the loads that the input port contributes to. The loads may have changed significantly enough that the change need to be communicated to the output port of the driver leaf circuit. In step 1274, the method accesses the output port associated with this load, because the output port provides the leader and follower information of its loads. In step 1276, a first determination is made as to whether the load is a leader. If the load is a leader (1276-Yes), the YES path is taken and the method calculates a new isomorphic event times for every follower load of this output port in step 1278 and then determines a new minimum isomorphic event time in step 1280. In the alternative, if the load is a follower of this output port (1276-No), the NO path is taken and the method calculates a new isomorphic event time for this follower load in step 1282. In step 1284, a second determination is made as to whether the minimum isomorphic event time has changed. If the minimum isomorphic event time has changed (1284-Yes), the YES path is taken and the method updates the minimum isomorphic event time in step 1286. But if the minimum isomorphic event time has not changed (1284-No), the NO path is taken. In step 1288, the method returns the newly updated minimum isomorphic event time. In step 1290, a third determination is made as to whether the minimum isomorphic event time returned by the procedure is less then the currently scheduled minimum isomorphic event time of the output port isomorphic event. If the minimum isomorphic event time returned by the procedure is less then the currently scheduled minimum isomorphic event time (1290-Yes), the YES path is taken and this isomorphic event is removed from the queue in step 1292 and it is rescheduled with the new event time at step 1294. Else if the minimum isomorphic event time returned by the procedure is not less then the currently scheduled minimum isomorphic event time (1290-No), the currently scheduled minimum isomorphic event time remains to be the same and the method ends in step 1296.

Multi-Rate Event Synchronization

Figure 13A:
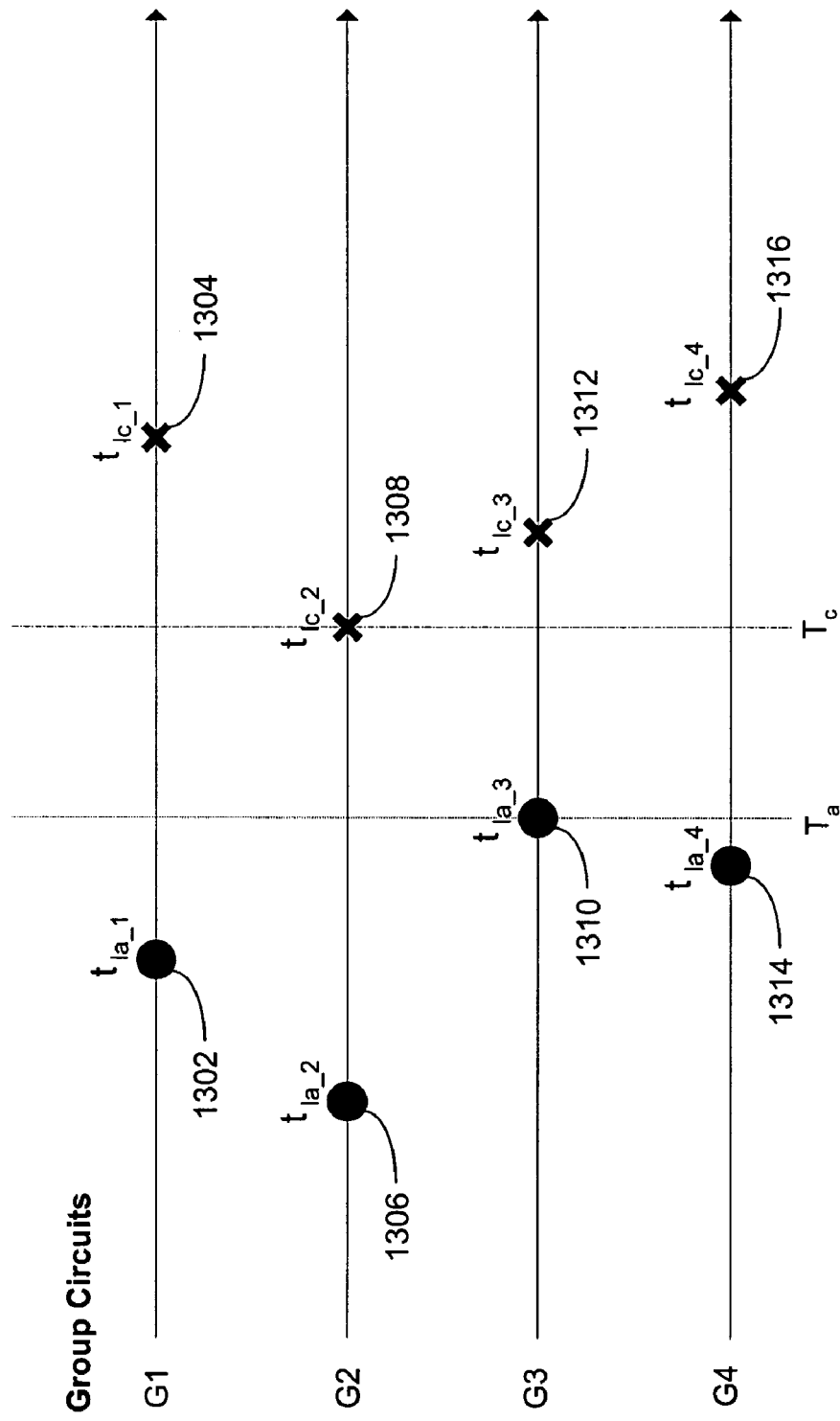
FIG. 13A illustrates an event diagram for handling multirate circuit simulation.

FIG. 13A illustrates an event diagram for handling multi-rate circuit simulation. The event diagram indicates the progress of individual group circuit over time. As shown, there are four group circuits G1, G2, G3, and G4. Time increases from left to right as indicated by the arrows. The progress of each group circuit is listed on a separate timeline. Each group circuit is defined to have two local times, one is a local accepted time and the other is a local current time. For example, for the group circuit G1, the local accepted time is $T_{1a\_1}$ 1302 and the local current time is $T_{1c\_1}$ 1304. Likewise, the local accepted time and the local current time for group circuit G2 are $T_{1a\_2}$ 1306 and $T_{1c\_2}$ 1308 respectively. The local accepted time and the local current time for group circuit G3 are $T_{1a\_3}$ 1310 and $T_{1c\_3}$ 1312 respectively. The local accepted time and the local current time for group circuit G4 are $T_{1a\_4}$ 1314 and $T_{1c\_4}$ 1316 respectively. The local accepted time marks the time point of the last accepted solution of the corresponding group circuit. The group circuit may at any point in time resume simulation from this time stamp. The local current time is a calculated next simulation point and therefore represents the time for next scheduled simulation. The local current time may be modified due to the arrival of new events. In addition, the local current time is greater than the local accepted time (i.e. $T_{1c} > T_{1a}$).

Given the local accepted times and the local current times, two global time parameters may be defined, namely the global accepted time and the global current time. The global accepted time $T_a$ is the maximum of all local accepted times. For the example shown in FIG. 13A, the global accepted time $T_a$ equals to the local accepted time $T_{1a\_3}$ of group circuit G3. No process is allowed to go back beyond the globally accepted time. In other words, once $T_a$ is established, there may not be any value exchange between the group circuits before time $T_a$. Every potential value change before the globally accepted time is considered to be an error of the synchronization scheme. On the other hand, the global current time is the minimum of all local current times. In this example, the global current time equals to the local current time $T_{1c\_2}$ of group circuit G2. The global current time is the minimum event time in the scheduled event queue. It indicates the next group circuits in the event queue to be processed by the simulator. In addition, the global current time becomes the next global accepted time when the current active group circuits are retrieved from the scheduled event queue for processing.

Figure 13B:
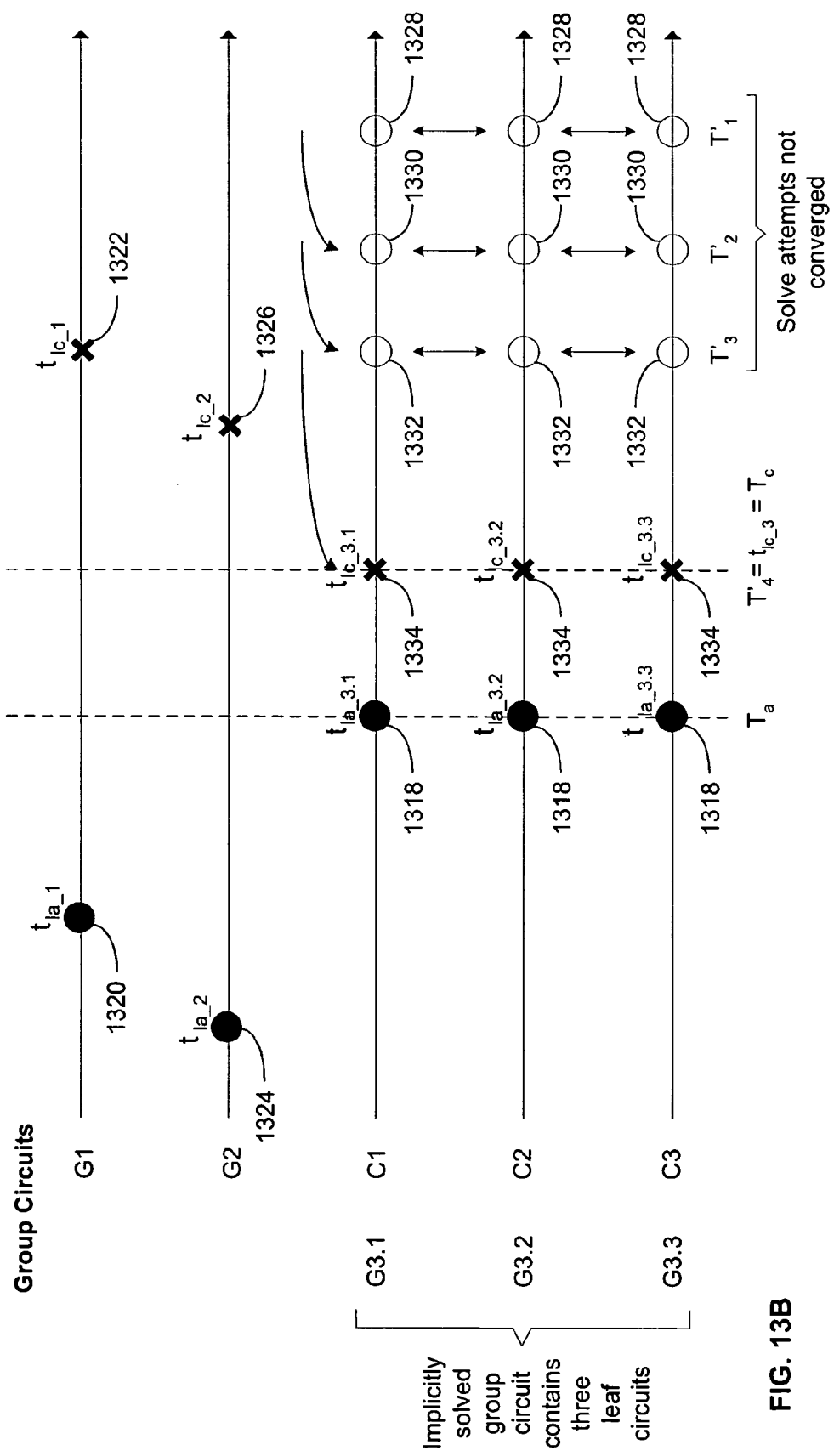
FIG. 13B illustrates a method for determining local current time in a multi-rate simulation environment.

FIG. 13B illustrates a method for determining local current time in a multi-rate simulation environment. The exemplary event diagram includes three group circuits G1, G2 and G3. The group circuit G3 further includes three leaf circuits C1, C2 and C3. The local accepted time and the local current time for group circuit G1 are $T_{1a\_1}$ 1320 and $T_{1c\_1}$ 1322 respectively. The local accepted time and the local current time for group circuit G2 are $T_{1a\_2}$ 1324 and $T_{1c\_2}$ 1326 respective. The local accepted time for group circuit G3 is $T_{1a\_3}$ 1318.

Since $T_{1a\_3}$ is larger than $T_{1a\_1}$ and $T_{1a\_2}$, it is also the global accepted time for the group circuits G1, G2 and G3.

The local current time for group circuit G3 is determined by the steps described below. As shown in FIG. 13B, $T'_1$ 1328 indicates the first calculated current time for the group circuit G3. The double arrows indicate communications, both in forward and backward directions, among the leaf circuits C1, C2 and C3 within the group circuit G3. Hollow circles indicate the solutions do not converge, and crosses indicate the solutions do converge. Since the solutions do not converge at $T'_1$, a second calculation is performed and a new current time is obtained at $T'_2$. Since the solutions do not converge at time $T'_2$, indicated by the hollow circles 1330, the process continues and calculates a new current time at $T'_3$ 1332. This process continues until the solutions converge at $T'_4$, which is indicated by crosses 1334. The time stamp when solutions converge becomes the local current time for group circuit G3, which is $T_{1c\_3}$. Since $T_{1c\_3}$ is less than $T_{1c\_1}$ and $T_{1c\_2}$, it becomes the global current time $T_C$ for group circuits G1, G2 and G3.

In general, to minimize event communications, the data paths between the processes are associated with their corresponding event tolerances. In some embodiments, predicting event communications in the future may be done by linear interpolation, linear extrapolation, or other higher order approximations. For example, a linear interpolation is performed when isomorphic events communicated through a port connectivity interface for a particular circuit is available. With propagated isomorphic events containing changes of signal conditions from other circuits, isomorphic computations may be performed for calculating the event times of the corresponding port connectivity interfaces and the output ports. Based on the isomorphic computations, a determination is made as to whether a particular circuit would potentially diverge. This determination is performed by comparing a set of predicted signal conditions to a set of predetermined isomorphic event tolerance values. The newly scheduled time is the predicted new time for next simulation of the circuit. Note that an event of a circuit is the actual group event, and circuits in the group share the same group event.

Figure 13C:
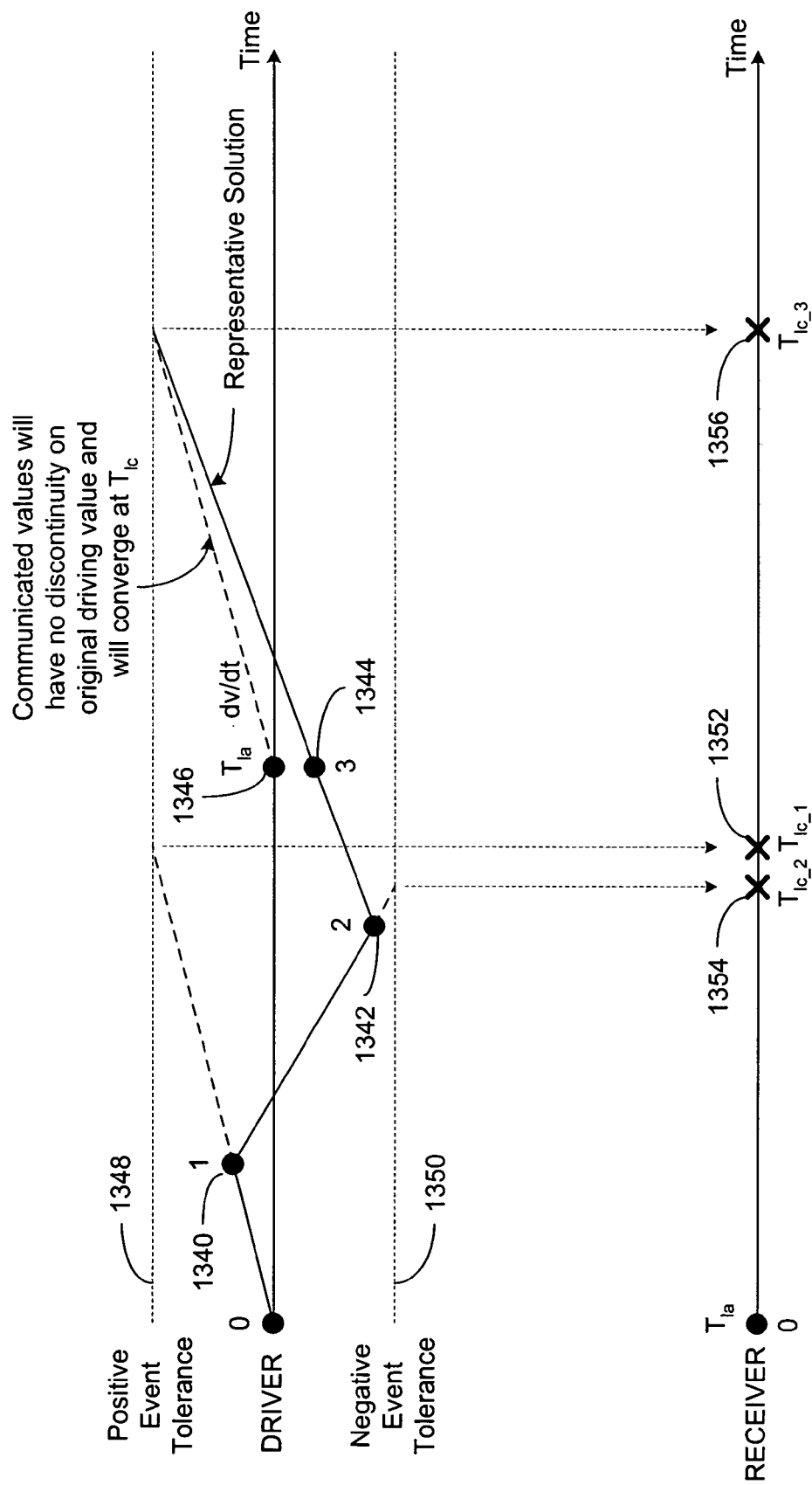
FIG. 13C illustrates a method for communicating a forward event in a multi-rate simulation environment.

FIG. 13C illustrates a method for communicating a forward event in a multi-rate simulation environment. The method starts at time 0 which is a common local accepted time for both the driver circuit and the receiver circuit. At time 1, a solution for the driver circuit is computed. Since the solution at time 1 lies within the positive event tolerance 1348 and the negative event tolerance 1350, there is no need to communicate this solution to the receiver at time 1. However, through linear interpolation, the predicted time the driver circuit would be out of the positive event tolerance limit (indicated by the dotted line) is at $T_{1c\_1}$ 1352. Thereafter, the process of solving the driver circuit continues and a new solution is reached at time 2. Again, since the solution at time 2 is within the negative event tolerance 1350, there is no need to communicate this solution to the driver circuit at time 2. However, through linear interpolation, the predicted time the driver circuit would be out of the negative event tolerance limit is at $T_{1c\_2}$ 1354. The solution process continues and a new solution point is reached at time 3. For the solution at time 3, the predicted time the driver circuit would be out of the positive event tolerance limit is at $T_{1c\_3}$ 1356. Assuming the solution at time 3 is accepted, the voltage value at time 3 1344 and a rate of change of voltage (dv/dt) at time 3 are communicated from the driver to the receiver. Note that the voltage value at time 3 and the rate of change of voltage (dv/dt) at time 3 are the solution values of a leader driver circuit, which are representative of the solution values of one or more follower driver circuits within a predetermined threshold of tolerance level. In another embodiment, the actual solution values may be different from the values communicated to avoid generating discontinuities in the receiving solver matrices. The communicated solution values are the voltage value 1346 at $T_{1a}$ and a modified rate of change of voltage (dv/dt) represented by the dotted line.

Load Sharing

Figure 2:
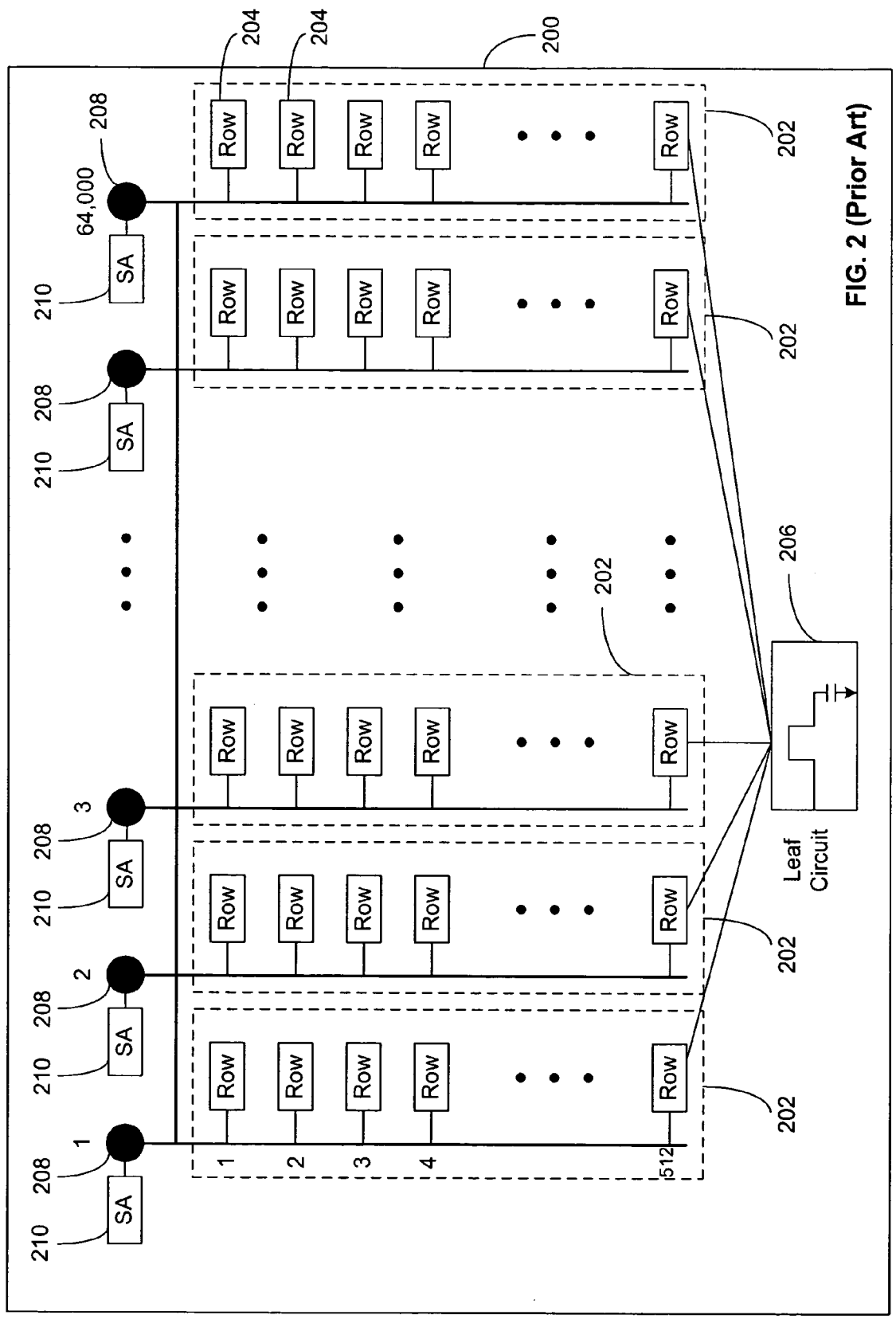
FIG. 2 illustrates the repetitive structure of a typical memory circuit.
Figure 4:
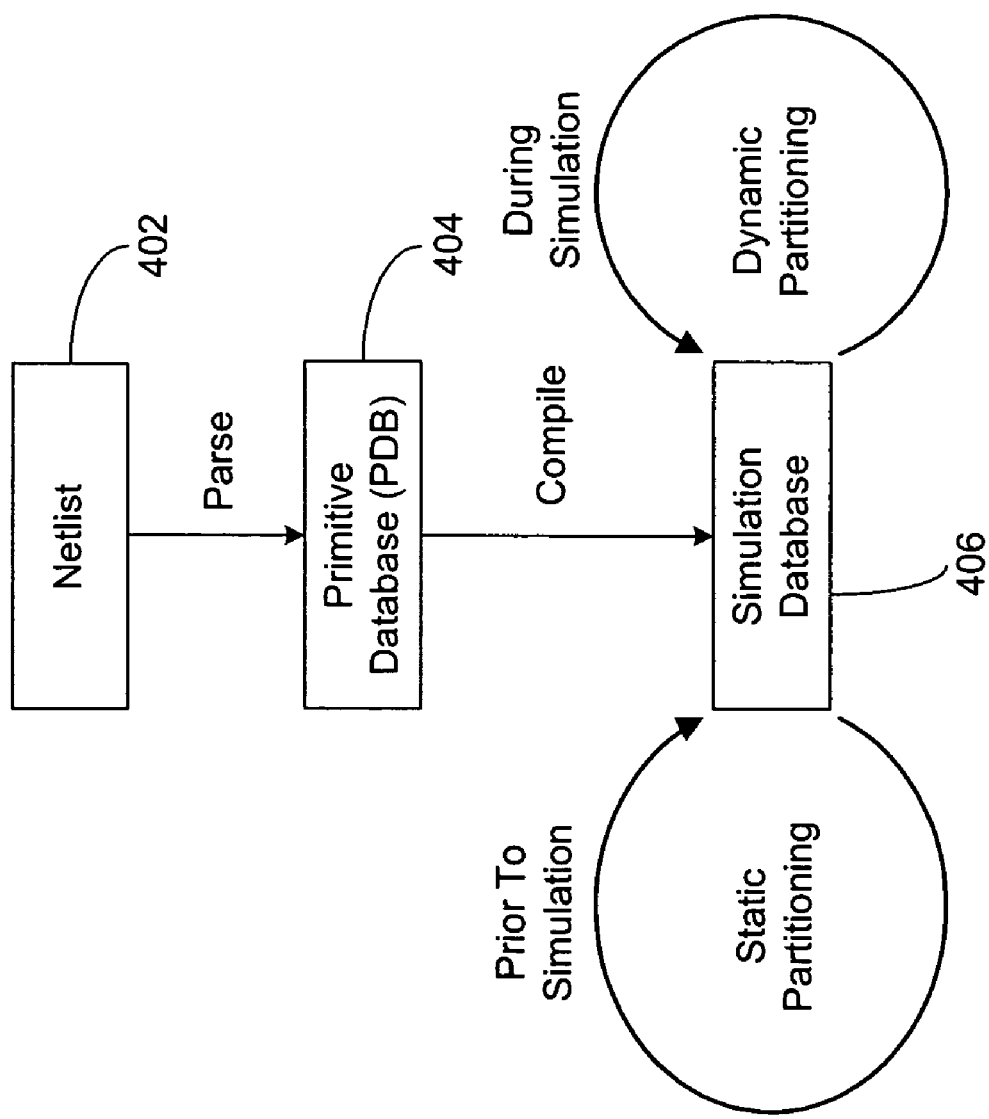
FIG. 4 illustrates a process for creating a simulation database for a circuit represented in hierarchical data structure.
Figure 5:
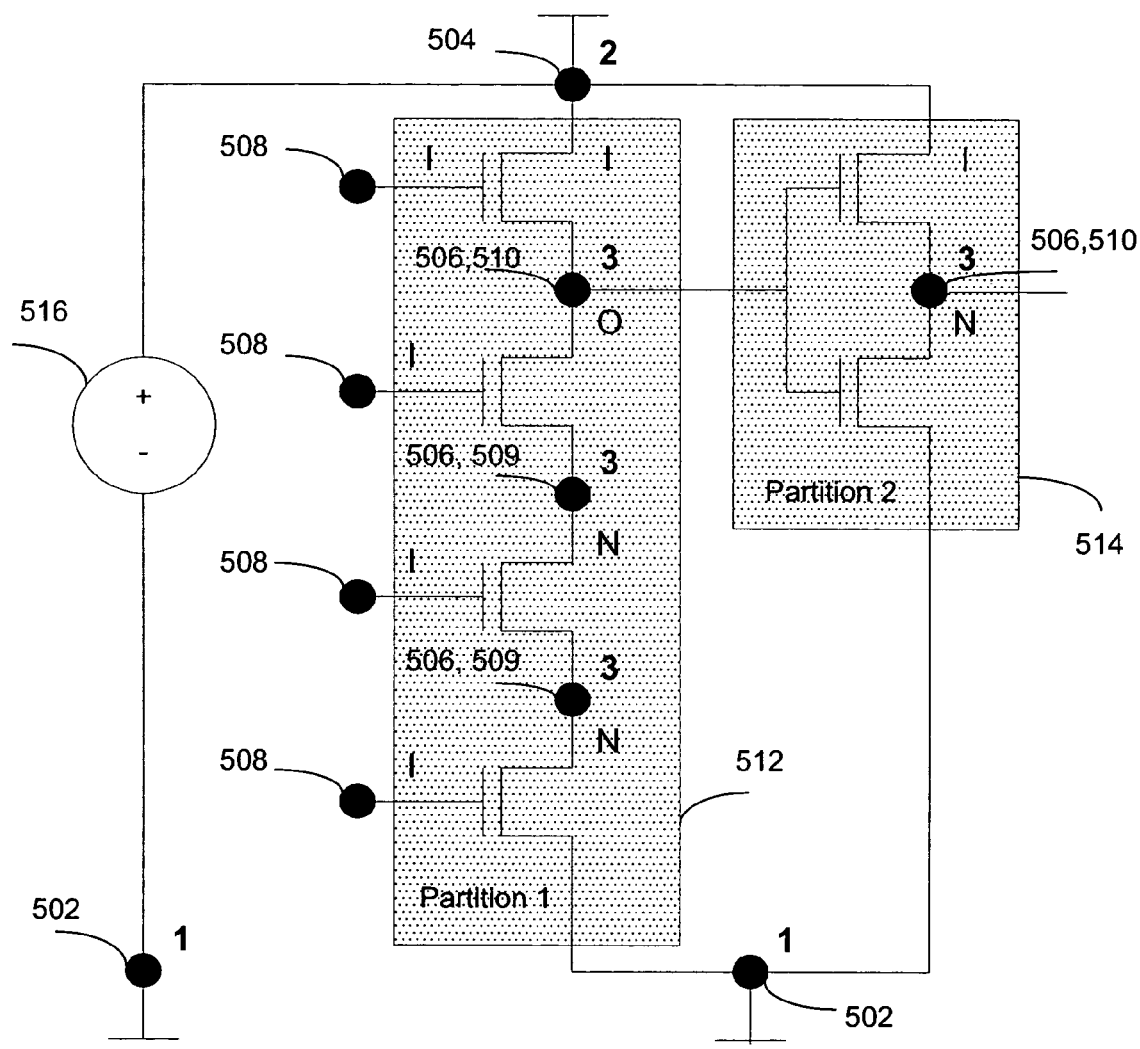
FIG. 5 illustrates a method for performing the static partitioning step in FIG. 4 for building the simulation database.
Figure 6:
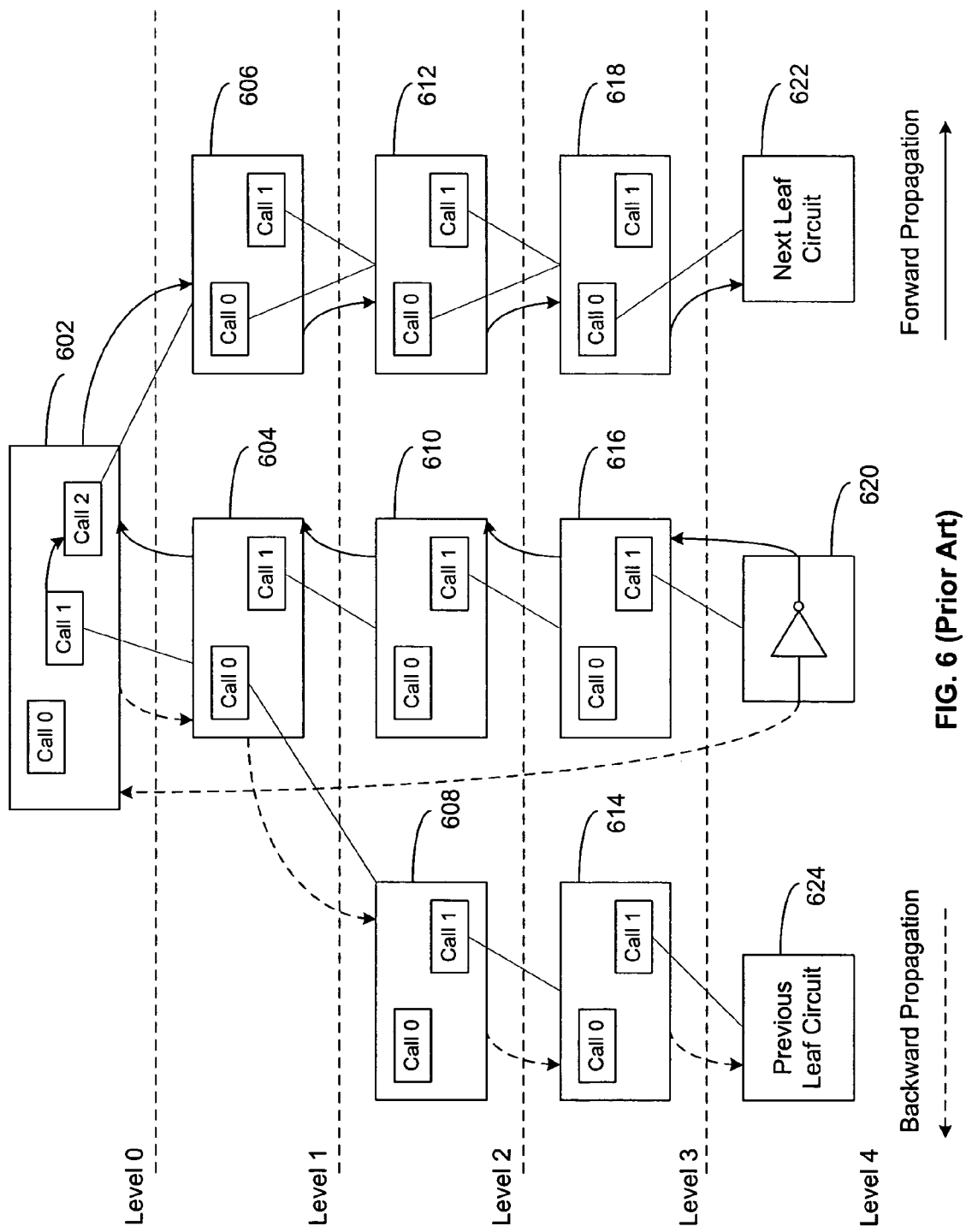
FIG. 6 illustrates a method of communicating a simulation solution in a hierarchical data structure.
Figure 14A:
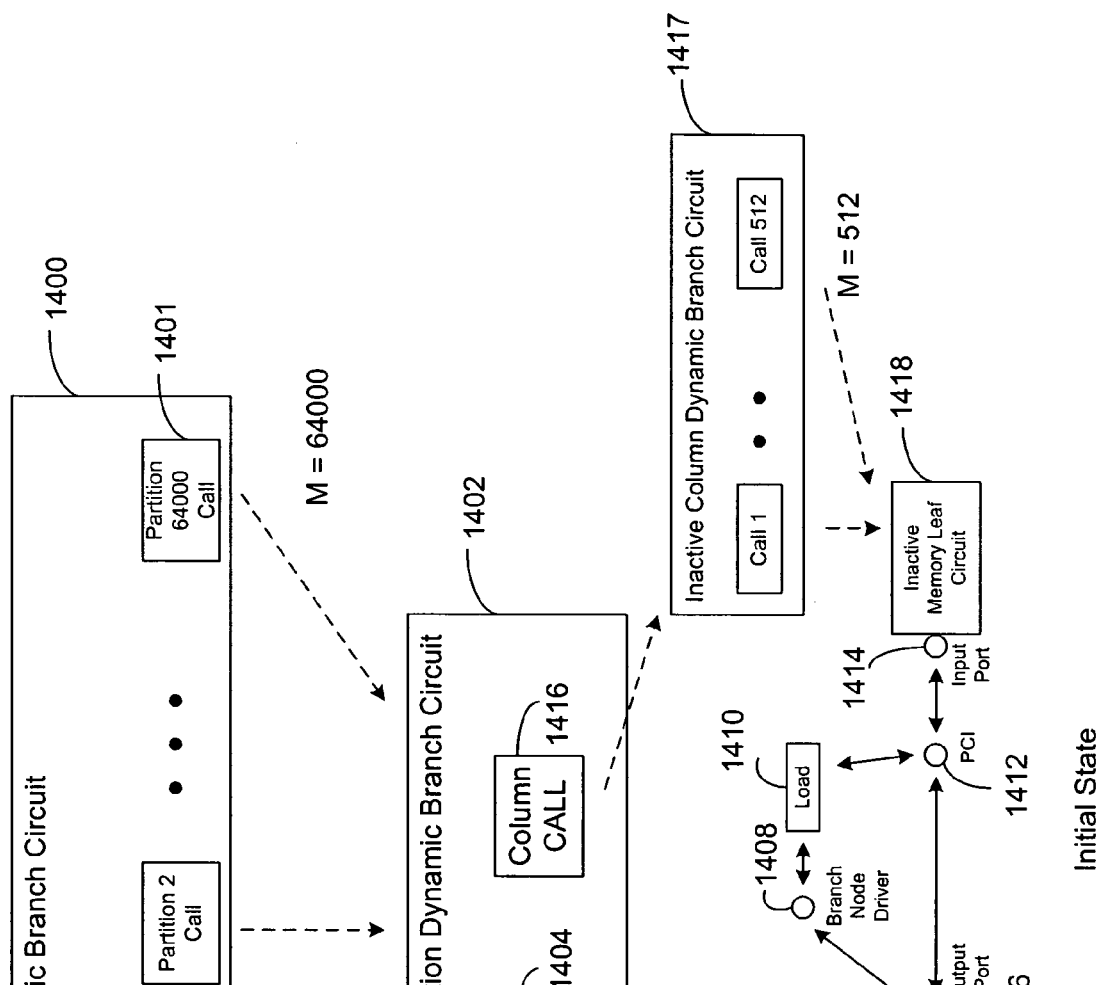
FIG. 14A illustrates a representation of the memory circuit of FIG. 2 as dynamic branch circuits prior to simulation.

FIG. 14A illustrates a representation of the memory circuit of FIG. 2 as dynamic branch circuits prior to simulation. In the initial steady state, the repetitive memory circuit topology may be represented hierarchically as a root dynamic branch circuit 1400 which contains 64,000 calls 1401 to an inactive partition dynamic branch circuit 1402. The inactive partition dynamic branch circuit 1402 includes a sense amplifier (SA) call 1404 which references to an inactive sense amplifier leaf circuit 1405 in the solution layer, and a column call 1416 which references to an inactive column dynamic branch circuit 1417, and the inactive column dynamic branch circuit 1417 in turn calls an inactive memory leaf circuit 1418 in the solution layer. The solution layer further includes an output port 1406 of the inactive sense amplifier leaf circuit 1405, a branch node driver 1408, a load 1410, a port connectivity interface 1412, an input port 1414 of the inactive memory leaf circuit. In this initial steady state, the load of each column of the memory circuit is substantially the same and is collectively represented in the block 1410. The output port of the inactive sense amplifier leaf circuit 1405 communicates with the circuits in the inactive column dynamic branch circuit 1417 through the port connectivity interface (PCI) 1412. In the initial steady state, the PCI 1412 contains an one-element array because one load is sufficient to represent the 512 rows of repetitive inactive memory leaf circuits in each column. As a result, this dynamic data representation of memory circuit effectively shares the input port load contributions of 512 inactive memory leaf circuits in the initial steady state. The load 1410 is computed by multiplying the input port load of the inactive memory leaf circuit 1418 by 512. The number of repetitive loads shared in the disclosed dynamic circuit representation is sometimes referred to as the multiplier (M) factor. In this example, the M factor equals 512. One of the benefits of using the M factor is that the simulator may use the load of a group of repetitive circuit elements only once in computing for a solution instead of retrieving the input port load from each repetitive circuit element of the group M times and perform a corresponding computation M times for reaching a solution.

Figure 14B:
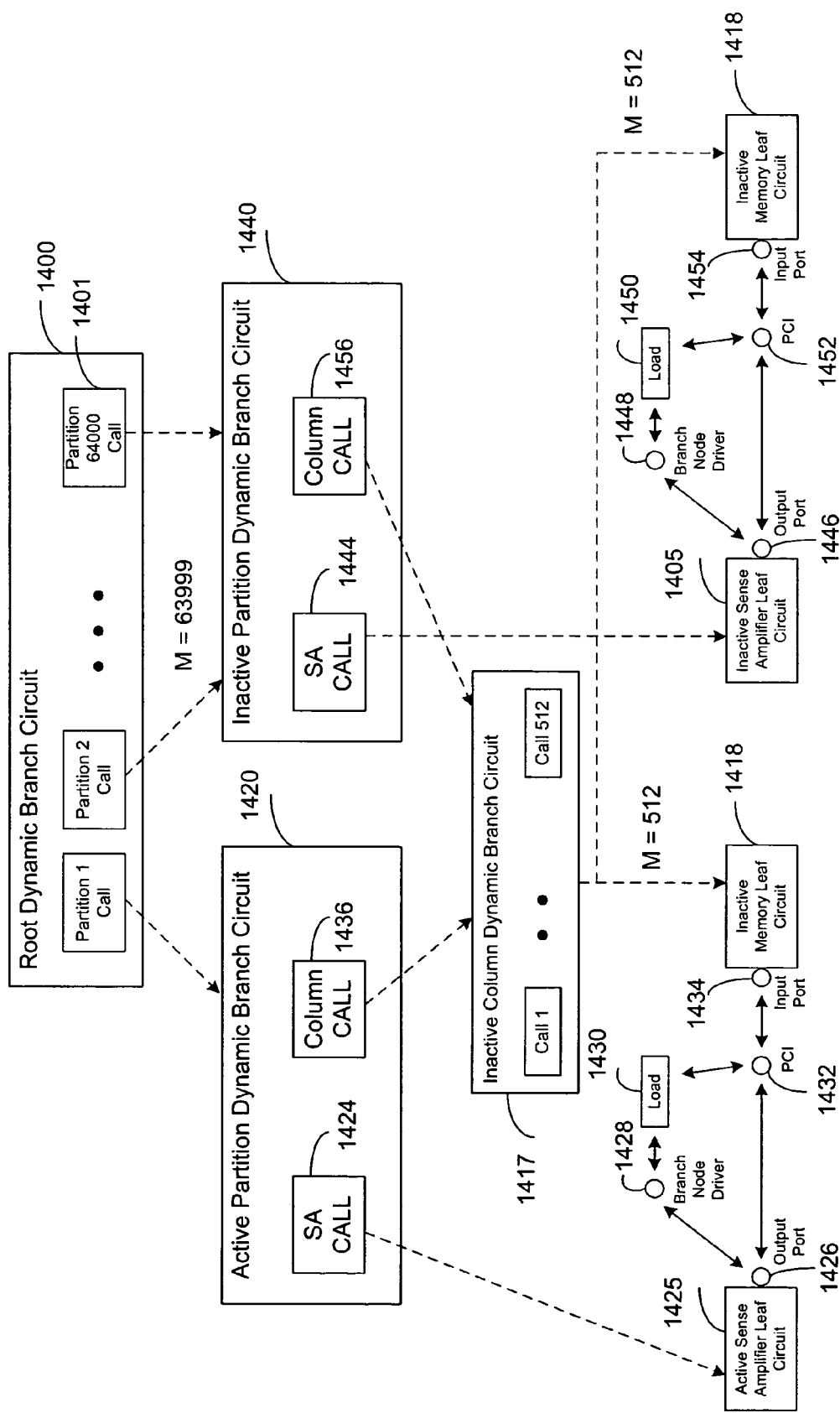
FIG. 14B illustrates a method for sharing loads of the memory circuit of FIG. 2 during one phase of the simulation.

FIG. 14B illustrates a method for sharing loads of the memory circuit of FIG. 2 when a sense amplifier becomes active during simulation. During a read or write access of the memory of FIG. 2, one of the 64,000 sense amplifiers 210 becomes active, which causes the isomorphic behavior between the active sense amplifier and the inactive sense amplifiers in the memory circuit to diverge. The simulator identifies and copes with this situation dynamically by creating isomorphic circuit partitions. In this scenario, the initial inactive partition dynamic branch circuit 1402 is split into an active partition dynamic branch circuit 1420 representing the active part of the memory circuit and an inactive partition dynamic branch circuit 1440 representing the remaining inactive part of the memory circuit. The active partition dynamic branch circuit 1420 includes a sense amplifier call 1424 which references to an active sense amplifier leaf circuit 1425 in the solution layer, and a column call 1436 which references to an inactive column dynamic branch circuit 1417, and the inactive column dynamic branch circuit 1417 in turn references to an inactive memory leaf circuit 1418 in the solution layer. The corresponding solution layer of the newly created active partition dynamic branch circuit 1420 further includes an output port 1426 of the active sense amplifier leaf circuit 1425, a branch node driver 1428, a load 1430, a PCI 1432, an input port 1434 of the inactive memory leaf circuit 1418. In this state, the loads of the inactive memory leaf circuits in the column containing the memory cell to be accessed are still substantially the same and are collectively represented in the load 1430. The output port of the sense amplifier communicates with the inactive memory cell leaf circuits in the column through the PCI 1432. Since the inactive memory cell leaf circuits in the column are substantially the same, they too are collectively represented by only one leaf circuit 1418 having an input port 1434. In the exemplary memory circuit, this dynamic data representation of active partition dynamic branch circuit 1420 effectively shares the loads of 512 inactive memory leaf circuits in the column driven by the active sense amplifier. As a result, this dynamic data representation of memory circuit effectively shares the input port load contributions of 512 inactive memory leaf circuits under the active partition dynamic branch circuit 1420 when one of the sense amplifier is active and the corresponding column branch circuit is still inactive. The load 1430 is computed by multiplying the input port load of the inactive memory leaf circuit 1418 by 512.

The inactive partition dynamic branch circuit 1440 includes a SA call 1444 which references to an inactive sense amplifier leaf circuit 1405 in the solution layer, and a column call 1456 which references to an inactive column dynamic branch circuit 1417, and the inactive column dynamic branch circuit 1417 in turn references to an inactive memory leaf circuit 1418 in the solution layer. The corresponding solution layer of the newly created inactive partition dynamic branch circuit 1440 further includes an output port 1446 of the inactive sense amplifier leaf circuit 1405, a branch node driver 1448, a load 1450, a PCI 1452, an input port 1454 of the inactive memory leaf circuit 1418. The loads of each inactive column of the memory circuit are substantially the same and are collectively represented in the block 1450. The output port of the inactive sense amplifier leaf circuit communicates with the inactive memory leaf circuits in each inactive column through the PCI 1452. Since the inactive memory leaf circuits are substantially the same, they too are collectively represented by only one leaf circuit 1418 having an input port 1454. The PCI 1452, which supports the inactive partition dynamic branch circuit 1440, contains an one-element array with one input port and one load. The input port 1454 represents the input port of the inactive memory leaf circuit 1418 driven by the inactive sense amplifier leaf circuit 1405. There is one load 1450 representing the load of 512 inactive memory leaf circuits 1418. As a result, this dynamic data representation of memory circuit effectively shares the input port load contributions of 512 inactive memory leaf circuits under the inactive partition dynamic branch circuit 1440 when one of the sense amplifier is active. Similarly, the load 1450 is computed by multiplying the input port load of the inactive memory leaf circuit 1418 by 512.

FIG. 14C illustrates a method for sharing loads of the memory circuit of FIG. 2 when one of the memory leaf circuits driven by the corresponding active sense amplifier is active. In another period of the simulation, when one of the memory leaf circuits driven by the corresponding active sense amplifier is active, which causes the isomorphic behavior between the active memory leaf circuit and the remaining inactive memory cell leaf circuits in the column to diverge. The simulator identifies and copes with this situation dynamically by splitting circuit partitions. In one embodiment, the simulator creates an active column branch circuit referenced by the active partition dynamic branch circuit 1420. The inactive partition dynamic branch circuit 1440 remains the same as in FIG. 14B. The newly created active column dynamic branch circuit 1437 includes a call which references to an active memory leaf circuit 1476 in the solution layer, and the remaining 511 calls reference to the same inactive memory leaf circuit 1418 in the solution layer. The solution layer further includes an output port 1466 of the active sense amplifier leaf circuit 1425, a branch node driver 1468, a load 1470, a PCI 1472, an input port 1474 of the active memory leaf circuit 1476, The load 1470 consists of only the input port load of the active memory leaf circuit 1476. The load 1450 consists of two loads, one load represents the input port contributions of the remaining 511 inactive memory leaf circuits of the active column dynamic branch circuit 1437, and the other load represents the input port contributions of the 512 inactive memory leaf circuits of the inactive column dynamic branch circuit 1417. The output port of the active sense amplifier leaf circuit 1466 communicates with the loads of the memory leaf circuits in the active column dynamic branch circuit 1437 through the PCI 1472.

In this example, the PCI 1472 contains an 1×1 array because there are only one load (input port of the active memory leaf circuit 1476) and one input port 1474. On the other hand, the PCI 1452 contains a 2×1 array because there are two loads and one input port 1454. One of the two loads represents the 511 inactive memory leaf circuits of the active column branch circuit, and the other load represents the 512 inactive memory leaf circuits of the inactive column dynamic branch circuit 1417. This dynamic data representation effectively shares the input port load contributions of 511 inactive memory leaf circuits under the active column dynamic branch circuit 1437 when one of the memory leaf circuits in the column is active, and shares the input port load contributions of 512 inactive memory leaf circuits of the inactive column dynamic branch circuit 1417. Thus, a substantial amount of computational compression is achieved during this period of simulation.

The disclosed circuit simulator provides at least six advantages. First, it distinguishes between the static information and the dynamic information of the circuit under simulation. Since the static database of the circuit is not modified, topology information of the circuit may be accurately retrieved from the static database during simulation. In addition, because it duplicates and reproduces only the relevant dynamic information when necessary, the disclosed circuit simulator uses less memory and produces better performance. Second, the disclosed circuit simulator provides a method for compressing two or more leaf circuits which demonstrate substantially the same isomorphic behavior into a merged leaf circuit. There are less number of circuits in the dynamic database and less number of computations are performed during simulation, which results in less memory usage and higher simulation performance. Third, the circuit simulator adaptively adjusting the group circuit matrix for computing a group of circuits according to the strength of coupling between the circuits. Hence, it achieves higher simulation performance by reducing either the size of the solver matrix when the circuits are loosely coupled to each other, or by reducing the number of computational repetitions due to the communication of changes of signal conditions between circuits by combining the individual circuit matrices when such circuits are closely coupled to each other. Fourth, the disclosed circuit simulator provides an efficient way to communicate computational solutions of a circuit component to other circuit components that may be affected by the computational solutions both in the forward and backward directions without traversing the many levels of hierarchical data structure. Since there is no traverse of the hierarchical data structure in communication computational solutions, there is no resources used and no timing delay for synchronizing the computational solutions at each level of the hierarchical data structure. Thus, the disclosed circuit simulator improves the performance of the simulation. Fifth, the disclosed circuit simulator provides a more efficient way to support multi-rate simulation by dynamically scheduling and synchronizing multiple group simulation event types and by communicating corresponding isomorphic activities through an efficient port connectivity interface. Finally, the disclosed circuit simulator provides a method to represent the loads of repetitive circuit components in a compact manner and efficiently communicates the changes to the loads through the port connectivity interface and the branch node driver. As a result, it uses less memory and at the same time improves the performance of the simulation.

One skilled in the relevant art may recognize that various modifications of the disclosure may work with the inventive integrated circuit simulator while preserving the spirit of the present invention. In one embodiment, the map of the port connectivity interface may be implemented in a multi-dimensional array of various sizes according to the number of loads, input ports and output ports of the particular group circuit under simulation. For example, a one dimensional array may be used if there is only one load, one input port and one output port in the particular group circuit. In another embodiment, different event tolerance requirements and different parameters may be used for determining the isomorphism between two circuits. Yet in another embodiment, different methodologies may be employed to partition a circuit for identifying the circuit components and their corresponding connectivity to other circuit components.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of simulating a circuit having a hierarchical data structure, comprising:
   representing the circuit as a hierarchically arranged set of branches, including a root branch and a plurality of other branches logically organized in a graph; the hierarchically arranged set of branches including a first branch that includes one or more leaf circuits and a second branch that includes one or more leaf circuits; wherein the first branch and second branch are interconnected in the graph through a third branch at a higher hierarchical level in the graph than the first and second branches;
   selecting a group of leaf circuits from the first and second branches for simulation;
   representing the two or more leaf circuits as a merged leaf circuit in response to two or more leaf circuits of the circuit having a substantially same isomorphic behavior;
   creating a first port connectivity interface dynamically for the group of leaf circuits in response to the merged leaf circuit; wherein the first port connectivity interface communicates changes in signal conditions among the group of leaf circuits;
   simulating the group of leaf circuits in accordance with the first port connectivity interface; and
   storing simulation results of the group of leaf circuits in a memory device.

2. The method of claim 1, wherein the substantially same isomorphic behavior comprises:
   a substantially same set of input signals within a predetermined threshold of signal tolerance are received by the two or more leaf circuits;
   a substantially same set of internal topologies, internal states and external loads within a predetermined threshold of signal tolerance associated with the two or more leaf circuits; and
   a substantially same set of output signals are produced within a predetermined threshold of signal tolerance by the two or more leaf circuits in response to the substantially same set of input signals.

3. The method of claim 1, wherein the substantially same isomorphic behavior is monitored at the output ports of the leaf circuits and at the first port connectivity interface of the group of leaf circuits.

4. The method of claim 1, wherein the first port connectivity interface comprises:
   a set of input vectors for referencing to a set of input ports of one or more receiver leaf circuits;
   a set of output vectors for referencing to a set of output ports of one or more driver leaf circuits;
   a set of load vectors for referencing to a set of loads of the one or more driver leaf circuits; and
   an array of storage elements for storing information associating the set of loads to the set of input ports.

5. The method of claim 1, further comprising:
   splitting the merged leaf circuits into two or more individual leaf circuits in response to the two or more leaf circuits represented by the merged leaf circuit demonstrating substantially different isomorphic behaviors;
   creating a second port connectivity interface dynamically for the selected group of leaf circuits in response to the two or more individual leaf circuits; wherein the second port connectivity interface communicates changes in signal conditions among the group of leaf circuits; and
   simulating the group of leaf circuits in accordance with the second port connectivity interface.

6. The method of claim 5, wherein substantially different isomorphic behaviors include one or more elements selected from the group consisting of:
   a substantially different set of input signals within a predetermined threshold of signal tolerance are received by the two or more leaf circuits;
   a substantially different set of internal topologies, internal states and external loads within a predetermined threshold of signal tolerance associated with the two or more leaf circuits; and
   a substantially different set of output signals are produced within a predetermined threshold of signal tolerance by the two or more leaf circuits in response to the substantially same set of input signals.

7. The method of claim 5, wherein the substantially different isomorphic behaviors are monitored at the output ports of the leaf circuits and at the second port connectivity interface of the group.

8. The method of claim 5, wherein the second port connectivity interface comprises:

a set of input vectors for referencing to a set of input ports of one or more receiver leaf circuits;

a set of output vectors for referencing to a set of output ports of one or more driver leaf circuits;

a set of load vectors for referencing to a set of loads of the one or more driver leaf circuits; and an array of storage elements for storing information associating the set of loads to the set of input ports.

9. A system for simulating a circuit having a hierarchical data structure, comprising:

at least one processing unit for executing computer programs;

a user interface for performing at least one of the functions selected from the group consisting of entering a netlist representation of the circuit, viewing representations of the circuit on a display, and observing simulation results of the circuit;

a memory for storing static and dynamic information of the circuit;

a simulator module for simulating a circuit having a hierarchical data structure, wherein the simulator module is used in conjunction with at least a processing unit, a user interface and a memory, and the simulator module includes:

means for representing the circuit as a hierarchically arranged set of branches, including a root branch and a plurality of other branches logically organized in a graph; the hierarchically arranged set of branches including a first branch that includes one or more leaf circuits and a second branch that includes one or more leaf circuits; wherein the first branch and second branch are interconnected in the graph through a third branch at a higher hierarchical level in the graph than the first and second branches;

means for selecting a group of leaf circuits from the first and second branches for simulation;

means for representing the two or more leaf circuits as a merged leaf circuit in response to two or more leaf circuits of the circuit having a substantially same isomorphic behavior;

means for creating a first port connectivity interface dynamically for the group of leaf circuits in response to the merged leaf circuit; wherein the first port connectivity interface communicates changes in signal conditions among the group of leaf circuits; and means for simulating the group of leaf circuits in accordance with the first port connectivity interface.

10. The system of claim 9, wherein the substantially same isomorphic behavior comprises:

a substantially same set of input signals within a predetermined threshold of signal tolerance are received by the two or more leaf circuits;

a substantially same set of internal topologies, internal states and external loads within a predetermined threshold of signal tolerance associated with the two or more leaf circuits; and a substantially same set of output signals are produced within a predetermined threshold of signal tolerance by the two or more leaf circuits in response to the substantially same set of input signals.

11. The system of claim 9, wherein the substantially same isomorphic behavior is monitored at the output ports of the leaf circuits and at the first port connectivity interface of the group of leaf circuits.

12. The system of claim 9, wherein the first port connectivity interface comprises:

a set of input vectors for referencing to a set of input ports of one or more receiver leaf circuits;

a set of output vectors for referencing to a set of output ports of one or more driver leaf circuits;

a set of load vectors for referencing to a set of loads of the one or more driver leaf circuits; and an array of storage elements for storing information associating the set of loads to the set of input ports.

13. The system of claim 9, further comprising:

splitting the merged leaf circuits into two or more individual leaf circuits in response to the two or more leaf circuits represented by the merged leaf circuit demonstrating substantially different isomorphic behaviors;

creating a second port connectivity interface dynamically for the selected group of leaf circuits in response to the two or more individual leaf circuits; wherein the second port connectivity interface communicates changes in signal conditions among the group of leaf circuits; and simulating the group of leaf circuits in accordance with the second port connectivity interface.

14. The system of claim 13, wherein substantially different isomorphic behaviors include one or more elements selected from the group consisting of:

a substantially different set of input signals within a predetermined threshold of signal tolerance are received by the two or more leaf circuits;

a substantially different set of internal topologies, internal states and external loads within a predetermined threshold of signal tolerance associated with the two or more leaf circuits; and a substantially different set of output signals are produced within a predetermined threshold of signal tolerance by the two or more leaf circuits in response to the substantially same set of input signals.

15. The system of claim 13, wherein the substantially different isomorphic behaviors are monitored at the output ports of the leaf circuits and at the second port connectivity interface of the group.

16. The system of claim 13, wherein the second port connectivity interface comprises:

a set of input vectors for referencing to a set of input ports of one or more receiver leaf circuits;

a set of output vectors for referencing to a set of output ports of one or more driver leaf circuits;

a set of load vectors for referencing to a set of loads of the one or more driver leaf circuits; and an array of storage elements for storing information associating the set of loads to the set of input ports.

17. A computer program product, comprising a medium storing computer programs for executing by one or more computer systems, the computer program comprising:

a simulator module for simulating a circuit having a hierarchical data structure, wherein the simulator module is used in conjunction with at least a processing unit, a user interface and a memory, and the simulator module includes one or more computer programs containing instructions for:

representing the circuit as a hierarchically arranged set of branches, including a root branch and a plurality of other branches logically organized in a graph; the hierarchically arranged set of branches including a first branch that includes one or more leaf circuits and a second branch that includes one or more leaf circuits; wherein the first branch and second branch are interconnected in the graph through a third branch at a higher hierarchical level in the graph than the first and second branches;

selecting a group of leaf circuits from the first and second branches for simulation;

representing the two or more leaf circuits as a merged leaf circuit in response to two or more leaf circuits of the circuit having a substantially same isomorphic behavior;

creating a first port connectivity interface dynamically for the group of leaf circuits in response to the merged leaf circuit; wherein the first port connectivity interface communicates changes in signal conditions among the group of leaf circuits;

simulating the group of leaf circuits in accordance with the first port connectivity interface; and storing simulation results of the group of leaf circuits in a memory device.

18. The computer program product of claim 17, wherein the substantially same isomorphic behavior comprises:

a substantially same set of input signals within a predetermined threshold of signal tolerance are received by the two or more leaf circuits;

a substantially same set of internal topologies, internal states and external loads within a predetermined threshold of signal tolerance associated with the two or more leaf circuits; and a substantially same set of output signals are produced within a predetermined threshold of signal tolerance by the two or more leaf circuits in response to the substantially same set of input signals.

19. The computer program product of claim 17, wherein the substantially same isomorphic behavior is monitored at the output ports of the leaf circuits and at the first port connectivity interface of the group.

20. The computer program product of claim 17, wherein the first port connectivity interface comprises:

a set of input vectors for referencing to a set of input ports of one or more receiver leaf circuits;

a set of output vectors for referencing to a set of output ports of one or more driver leaf circuits;

a set of load vectors for referencing to a set of loads of the one or more driver leaf circuits; and an array of storage elements for storing information associating the set of loads to the set of input ports.

21. The computer program product of claim 17, further comprising instructions for:

splitting the merged leaf circuits into two or more individual leaf circuits in response to the two or more leaf circuits represented by the merged leaf circuit demonstrating substantially different isomorphic behaviors;

creating a second port connectivity interface dynamically for the selected group of leaf circuits in response to the two or more individual leaf circuits; wherein the second port connectivity interface communicates changes in signal conditions among the group of leaf circuits; and simulating the group of leaf circuits in accordance with the second port connectivity interface.

22. The computer program product of claim 21, wherein substantially different isomorphic behaviors include one or more elements selected from the group consisting of:

a substantially different set of input signals within a predetermined threshold of signal tolerance are received by the two or more leaf circuits;

a substantially different set of internal topologies, internal states and external loads within a predetermined threshold of signal tolerance associated with the two or more leaf circuits; and a substantially different set of output signals are produced within a predetermined threshold of signal tolerance by the two or more leaf circuits in response to the substantially same set of input signals.

23. The computer program product of claim 21, wherein the substantially different isomorphic behaviors are monitored at the output ports of the leaf circuits and at the second port connectivity interface of the group.

24. The computer program product of claim 21, wherein the second port connectivity interface comprises:

a set of input vectors for referencing to a set of input ports of one or more receiver leaf circuits;

a set of output vectors for referencing to a set of output ports of one or more driver leaf circuits;

a set of load vectors for referencing to a set of loads of the one or more driver leaf circuits; and an array of storage elements for storing information associating the set of loads to the set of input ports.

* * * * *